United States Patent [19]

Kato et al.

[11] Patent Number: 5,731,229
[45] Date of Patent: Mar. 24, 1998

[54] METHOD OF PRODUCING DEVICE HAVING MINUTE STRUCTURE

[75] Inventors: Makiko Kato, Fujisawa; Yasukazu Iwasaki, Yokosuka; Makoto Uchiyama, Miura, all of Japan

[73] Assignee: Nissan Motor Co., Ltd., Kanagawa, Japan

[21] Appl. No.: 495,273

[22] Filed: Jun. 27, 1995

[30] Foreign Application Priority Data

Jun. 28, 1994 [JP] Japan ................................ 6-145845
Mar. 23, 1995 [JP] Japan ................................ 7-63906

[51] Int. Cl.$^6$ ........................................ B05D 7/22
[52] U.S. Cl. ............................ 438/50; 438/51; 438/52; 438/53; 438/114; 427/230; 427/384
[58] Field of Search ..................... 437/225, 228, 437/228 O, 228 H, 228 SW, 226, 227, 901, 921, 927; 156/657.1, 656.1, 662.1; 361/283.4; 438/50, 51, 52, 53, 113, 114, 758, 780; 427/230, 384

[56] References Cited

U.S. PATENT DOCUMENTS

| | | | |
|---|---|---|---|
| 4,894,698 | 1/1990 | Hijikigawa et al. | 357/26 |
| 5,013,693 | 5/1991 | Guckel et al. | 437/248 |
| 5,090,254 | 2/1992 | Guckel et al. | 23/862.59 |
| 5,254,501 | 10/1993 | Tung et al. | 437/214 |
| 5,316,619 | 5/1994 | Masterrangelo | 156/644 |
| 5,447,067 | 9/1995 | Beible et al. | 73/514.32 |
| 5,470,797 | 11/1995 | Masterrangelo | 437/225 |
| 5,548,099 | 8/1996 | Cole, Jr. et al. | 437/225 |

FOREIGN PATENT DOCUMENTS

| | | |
|---|---|---|
| 63-041855 | 2/1988 | Japan . |
| 63-41855 | 2/1988 | Japan . |
| 2-23324 | 5/1990 | Japan . |
| 2-134570 | 5/1990 | Japan . |
| 4-242114 | 8/1992 | Japan . |

OTHER PUBLICATIONS

Wolf, Stanley "Silicon Progressing for the VLSI Era" vol. 1 pp. 516–520 (1986).

"Silicon Diaphragm Capacitive Sensor for Pressure, Flow, Acceleration and Attitude Measurements", by James T. Suminto et al., *Transducers '87*, pp. 336–339.

"Electrostatic Parallelogram Actuators," by N. Takeshima et al., *Transducers '91*, pp. 63–66.

"Encyclopedia Chemistry," *Kyoritsu Shuppan Kabushiki-kaisha*.

"Metal Physical Property Fundamental Lecture," *Interface Physical Property*, vol. 10, 1991.

Primary Examiner—Charles L. Bowers, Jr.
Assistant Examiner—Matthew Whipple
Attorney, Agent, or Firm—Lowe, Price, LeBlanc & Becker

[57] ABSTRACT

A method of producing a device having a minute structure such as a semiconductor element. The producing method comprises the following steps: (a) forming a film of liquid containing a sublimable material on a surface of a product of the device, the sublimable material being solid ordinary temperature and at normal pressure, the minute structure being formed at the surface of the product; (b) improving a wettability of at least one of the minute structure and a region surrounding the minute structure by the liquid film of the sublimable material; (c) converting the liquid film into a state containing the sublimable material in solid phase so as to form a protective film; and (d) vaporizing the protective film to be removed.

41 Claims, 13 Drawing Sheets

FIG.1
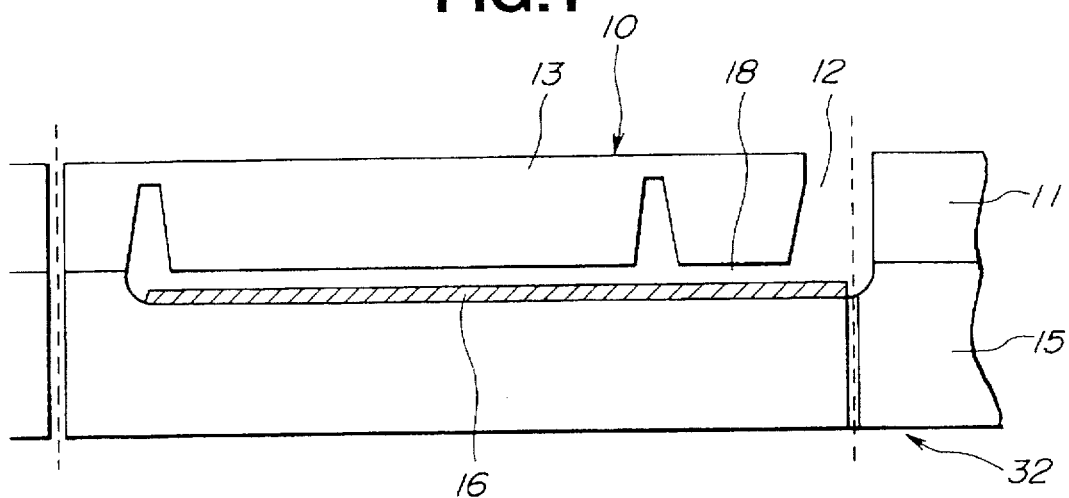
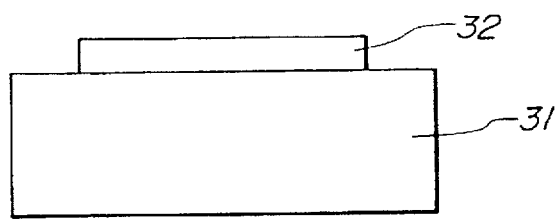
FIG.2A
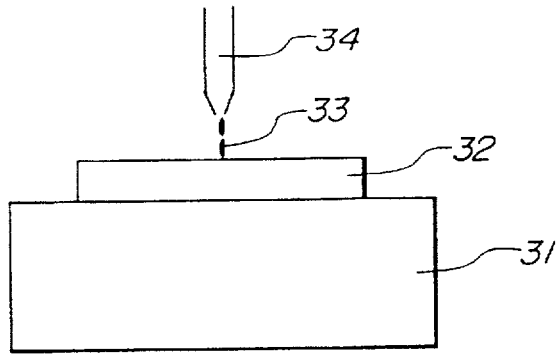
FIG.2B
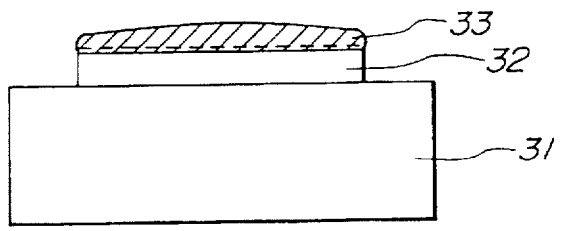
FIG2C

FIG.16
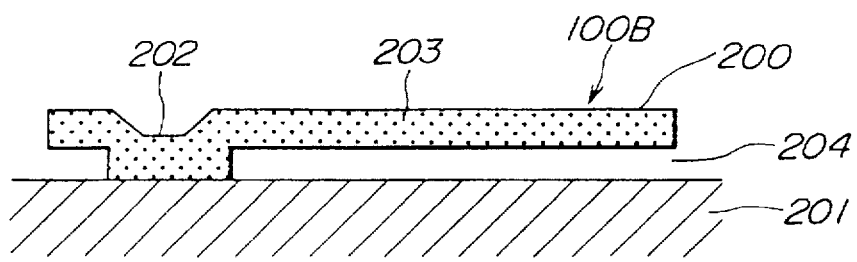
FIG.17A
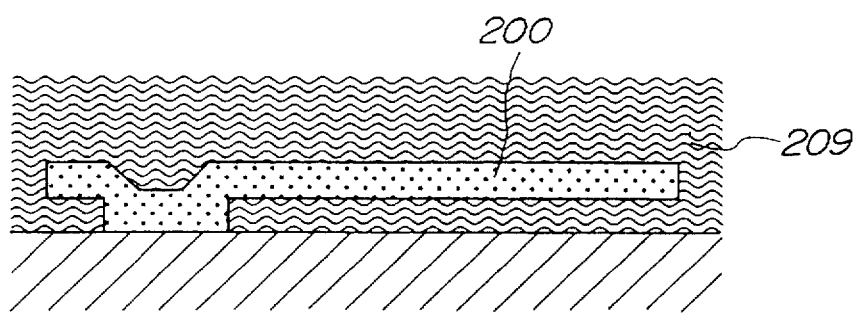
FIG.17B
FIG.17C
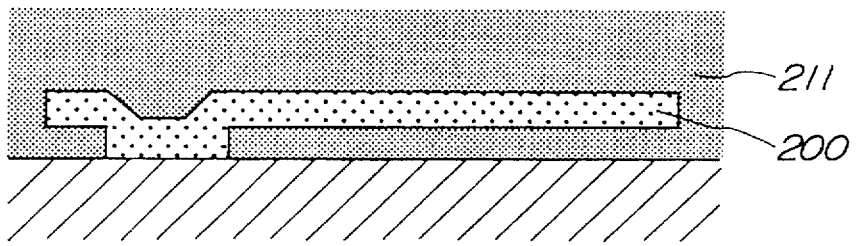
FIG.17D
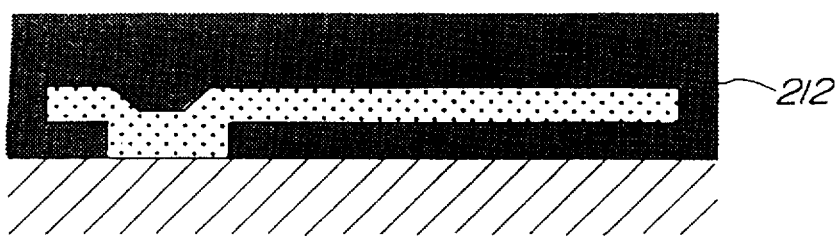
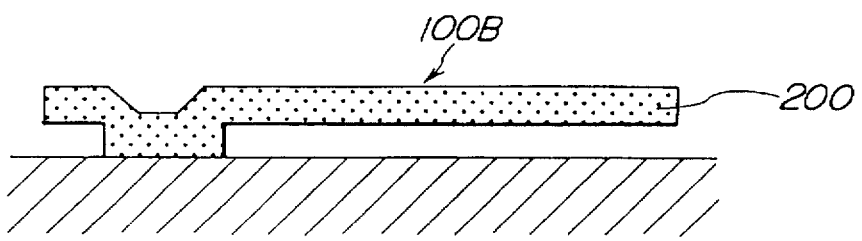

METHOD OF PRODUCING DEVICE HAVING MINUTE STRUCTURE

BACKGROUND OF THE INVENTION

1. Field of the Invention

This invention relates to improvements in a method of producing a device having a minute structure including a cavity and/or a movable section, and more particularly to such a method including a process of protecting the minute structure from contamination and damage particularly during production of the device.

2. Description of the Prior Art

Hitherto a variety of methods of producing minute devices such as micromachines have been proposed and put into practical use. Each minute device has a cavity and/or movable section. One of such producing methods have been disclosed in "Transducer '87 (The 4th international Conference on Solid-State Sensor and Actuators), pages 336–339" relating to a semiconductor capacitive acceleration sensor. This method is as follows: A silicon substrate is formed with a lead taking-out section, a weight section and a diaphragm section which are formed under anisotropic etching. A glass substrate 105 made of PYREX7740 (trademark) is provided with a fixed electrode and a bonding pad which are formed on the glass substrate. The silicon substrate is fixedly joined to the glass substrate under anodic bonding, and thereafter the thus joined substrates are divided into sensor chips by using a dicing saw. The thus obtained each sensor chip is formed with a cavity at the joining surface of the silicon and glass substrates, in which a lead of the fixed electrode is taken out through the cavity.

However, difficulties have been encountered in the above conventional producing method, in which a sufficient consideration is not made on the manner of taking out the lead, and therefore water and cutting powder will penetrate into the space around the fixed electrode through the cavity during a dicing process. Accordingly, a required performance of the acceleration sensor cannot be obtained. In view of this, a variety of producing methods to secure a reliability of the acceleration sensor has been proposed.

For example, Japanese Patent Provisional Publication No. 2-134570 discloses a manner of preventing contamination of a product during dicing. In this manner, a glass substrate is subjected to machining to form a groove. A lead taking-out section is formed at the bottom portion of the groove, and then a part of the groove is sealed with an insulating material such as glass. However, with this manner, a tight adhesion between the insulating material and the glass substrate is required, and therefore a high flattening technology is necessary while complicating the producing method of a minute device such as a capacitive acceleration sensor. Furthermore, even in case of using a low melting point glass or the like as the insulating material, the temperature required for sealing is as high as about 400° to 485° C. As a result, this manner is difficult to be used for a low heat-resistant element provided with a wiring material formed of aluminum or the like.

Additionally, the above publication discloses an acceleration sensor in which glass substrates having fixed electrodes are joined respectively to the upper and lower surfaces of a silicon substrate having a silicon beam and a movable electrode. The glass substrate is formed with a through-hole in which a conductive material is sealed to draw out a lead to the outside. However, this technology requires a much time for machining the through-hole in the glass substrate, and besides a process for forming a lead section inside the through-hole is complicated. As a result, drawbacks have been encountered in such a technology from the viewpoints of mass production and reliability of products.

The above conventional technologies are for providing a hermetically sealed structure in a minute device and therefore cannot be employed to produce a minute device having a through-hole communicating with the outside and a movable section.

Next, conventional technologies for temporarily sustaining and protecting a part of the minute structure of the minute device will be discussed.

For example, Japanese Patent Provisional Publication No. 63-41855 discloses a manner of temporarily forming a protective film by spin-coating a solution of sublimable material on a mask base thereby to prevent the mast base from direct adherence of dust. However, this manner employs a spin coating and therefore difficult to be applied for a structure having a cavity or a movable section.

Additionally, for example, a so-called freeze drying method for sustaining the movable section of a minute device is disclosed in detail in "ELECTROSTATIC PARALLELOGRAM ACTUATORS Transducers '91 (1991 International Conference on Solid-State Sensors and Actuators Digest of Technical Papers)", pages 63–66. The freeze drying method is a method in which liquid such as water or organic solvent is first applied to the movable section, then the applied liquid is refrigerated to be frozen, and lastly the frozen liquid is sublimated under vacuum. This freeze drying method is employed, for example, to prevent the movable section formed at the surface portion of a surface type micromachine from physically sticking with the substrate under the action of the surface tension of the liquid residing therebetween during a drying process of the micromachine, thereby protecting the movable section from its deformation or breakage. In case that a material (such as t-butyl alcohol) having a melting point in the vicinity of room temperature is used as the liquid to be applied, a molten liquid of the material can be readily obtained under easy heating, and therefore sustaining the movable section is made possible at a temperature lower than about 20° C. when the molten liquid is applied to the movable section.

However, the following drawbacks have been encountered in such a freeze drying method: It requires a special device for controlling temperature and pressure in practicing it. Additionally, it is necessary to maintain the temperature of ambient atmosphere at a considerably low level in order to prevent the frozen material from melting and sublimation for a short time during sustaining the movable section. Furthermore, concerning water and t-butyl alcohol which are soluble in aqueous solution, they cannot be used in a process employing the aqueous solution, such as a wet etching process or a rinsing process.

SUMMARY OF THE INVENTION

It is an object of the present invention to provide an improved method of producing a device having a minute structure, which can effectively overcome drawbacks encountered in a variety of conventional methods of producing a like device having a minute structure.

Another object of the present invention is to provide an improved method of producing a minute device having at least a cavity and a movable section, by which the cavity can be effectively prevented from its contamination while preventing the movable section from its damage during production of the minute device, thereby making possible to produce a high reliability minute device at a low cost.

A further object of the present invention is to provide an improved method of producing a device having a minute structure, by which a temporary protective film can be formed on a surface of a substrate and readily removable when it becomes unnecessary, thereby making possible to produce the device having the minute structure at a high productivity and a low production cost.

An aspect of the present invention resides in a method of producing a device having a minute structure. The producing method comprises the following steps: (a) coating a liquid containing a sublimable material on a minute structure of a product of the device, the sublimable material being solid at ordinary temperature and at normal pressure; (b) improving a wettability of at least one of the minute structure and a region surrounding the minute structure, by the liquid containing the sublimable material; (c) converting the liquid into a state containing the sublimable material in solid phase so as to form a protective mass of the sublimable material for protecting the minute structure; and (d) vaporizing the protective solid to be removed. The term "product" in the step (a) means both a finished or complete product and a so-called semi-finished product to which any physical or chemical treatment(s) is to be made in order to obtain the finished product. The term "protecting the minute structure" in the step (b) means not only protecting the minute structure from damaging, penetration of dust or the like thereinto but also preventing at least a part of the minute structure from sticking to another separate part of the device.

Another aspect of the present invention resides in a producing method of a device including a minute structure having at least one of a cavity and a movable section. The producing method comprises the following steps in the sequence set forth: (a) dissolving a sublimable material in a solvent to form a sublimable material solution, the sublimable material being solid at ordinary temperature and normal (atmospheric) pressure; (b) applying the sublimable material solution to the minute structure of a produce of the device, the solvent in the sublimable material solution having a characteristics that a wettability of a constituent material of the product by the solvent is so high as to form a thin film of the sublimable material solution on the surface of the constituent material; (c) converting the applied sublimable material solution into a state containing the sublimable material in solid state so as to fill the sublimable material in contact with the minute structure; and (d) removing the sublimable material under sublimation.

Accordingly, during production of the device, the sublimable material is filled in the cavity or around the movable section thus securely accomplishing temporary sealing and protection for the cavity and/or the movable section. This facilitates production of a high performance minute structure (such as a semiconductor capacitive acceleration sensor) which is high in productivity, at a low production cost.

A further aspect of the present invention resides in a method of producing a device having a minute structure. The producing method comprises the following steps: (a) forming a film of a liquid containing a sublimable material on a surface of a product of the device, the sublimable material being solid at ordinary temperature and at normal pressure, the minute structure being formed at the surface of the product; (b) improving a wettability of at least one of the minute structure and a region surrounding the minute structure, by said liquid film of the sublimable material; (c) converting the liquid film into a state containing the sublimable material in solid phase so as to form a protective film; and (d) vaporizing the protective film to be removed.

Accordingly, the temporary protective film can be effectively formed which is semi-transparent and has a long life without damaging the minute structure of the product of the device. As a result, the device having the minute structure can be produced at a high productivity and at a low production cost without the fear of contamination of the minute structure. The high productivity is realized under high yield of the product. The low production cost is realized under reduced steps required for the production, and a low equipment cost. Additionally, the temporary protective film can be easily and completely removed when it becomes unnecessary. As a result, for example, in case of employing the producing method in a dicing process for the wafer, chips of a device having a minute structure can be obtained at a high yield. For example, in case of employing the producing method in a drying process after etching a sacrifice layer, a minute structure can be easily formed without requiring a special facility and without causing a movable section of the minute structure to stick to the surface of the substrate.

BRIEF DESCRIPTION OF THE DRAWINGS

In the drawings, like reference numerals designate like elements and parts throughout all figures, in which:

FIG. 1 is a vertical sectional view of a semiconductor capacitive acceleration sensor (in the state of a semi-finished product) forming part of a wafer, showing a basic arrangement of the sensor, in connection with a first example of an embodiment of a producing method according to the present invention;

FIG. 2A to 2C are schematic illustrations showing the procedure of the producing method for the sensor of FIG. 1;

FIG. 16 is a schematic sectional view of a minute device, showing a basic arrangement, to which the principle of the embodiment of the producing method according to the present invention is applied; and FIGS. 17A to 17D are schematic sectional views showing the procedure of drying of the semi-finished product of the minute device of FIG. 16.

DETAILED DESCRIPTION OF THE INVENTION

Figure 3:
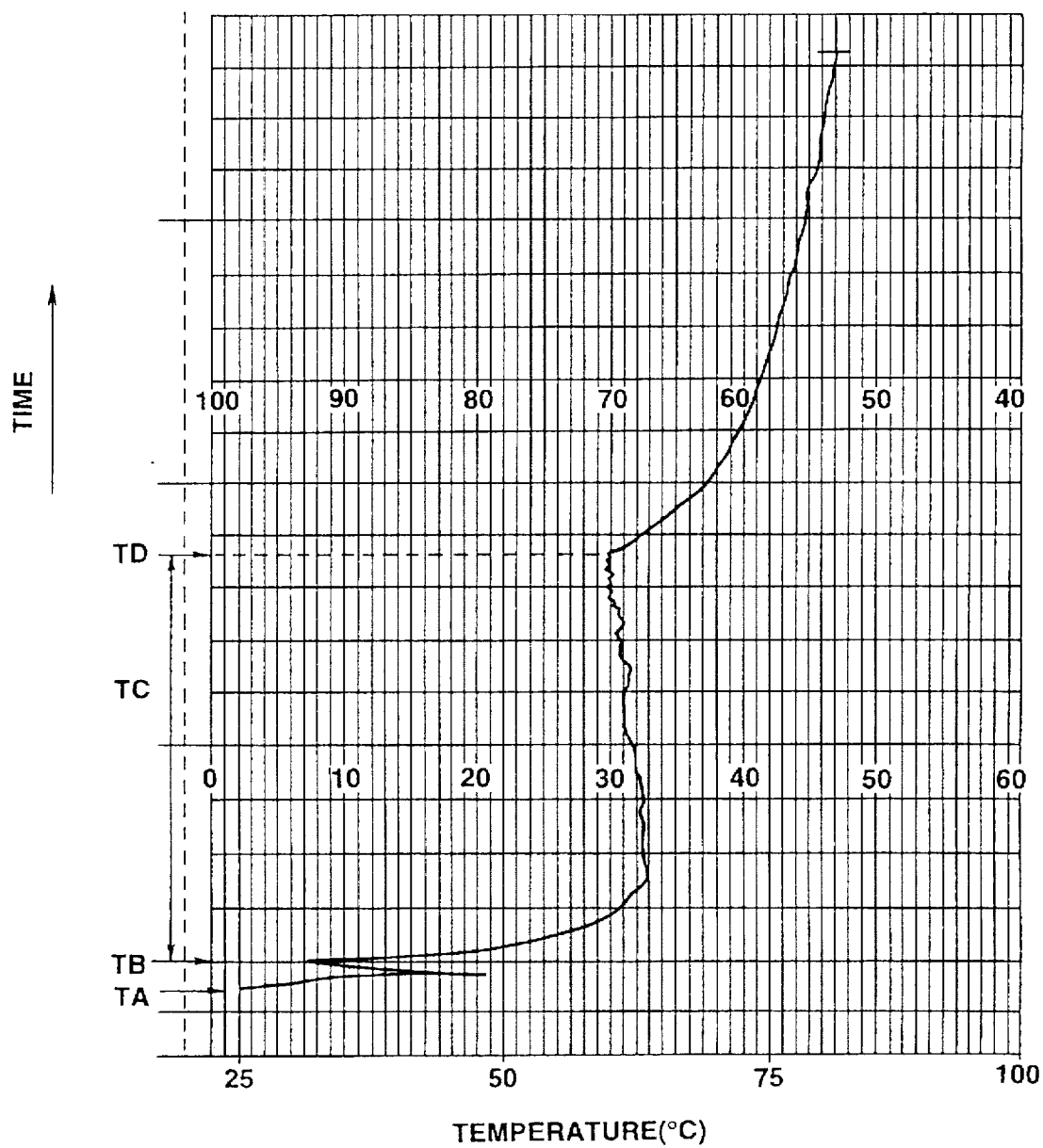
FIG. 3 is a graph showing a variation in temperature of the wafer of FIG. 1 in connection with the procedure of the producing method of FIG. 2A to 2C.

Referring now to FIGS. 1 to 6 of the drawings, an embodiment of a method of producing a device having a minute structure, according to the present invention will be discussed.

According to the principle of this embodiment, the producing method of a minute device including a minute structure having at least one of a cavity and a movable section comprises the following steps in the sequence set forth: (a) dissolving a sublimable material in a solvent to form a sublimable material solution, the sublimable material being solid at ordinary temperature and normal (atmospheric) pressure; (b) applying the sublimable material solution to the minute structure of a product of the minute device, the solvent in the sublimable material solution having a characteristics that a wettability of a constituent material of the product by the solvent is so high as to form a thin film of the sublimable material solution on the surface of the constituent material; (c) converting the applied sublimable material solution into a state containing the sublimable material in solid state so as to fill the sublimable material in contact with the minute structure; and (d) removing the sublimable material under sublimation.

FIGS. 1 and 2A to 2C illustrates a first example of the embodiment of the producing method according to the present invention, in which the minute device is a semiconductor capacitive acceleration sensor 10. As shown in FIG. 1, the acceleration sensor 10 as a sensor chip comprises a silicon substrate 11. More specifically, the reference numeral 10 designates a semi-finished product of the sensor to which any physical treatment is to made in order to obtain a finished product of the sensor. The sensor 10 is formed with lead taking-out section 12 and has a weight section 13. The weight section 13 is movable and therefore also referred to as a movable section or beam. The lead taking-out section 12 and the weight section 13 are formed by an anisotropic etching which is accomplished from the back side of the silicon substrate 11. A glass mount 15 made of a glass material (tradename: PYREX 7740) is formed with a depression (no numeral) which is formed by etching. An inner fixed electrode 16 is formed within the depression. The silicon substrate 11 and the glass mount 15 are fixedly jointed with each other by means of anode coupling so that a cavity 18 is formed together with the lead taking-out section 12 communicating with the outside.

The producing method of the acceleration sensor 10 will be discussed hereinafter with reference to FIGS. 2A to 2C and FIG. 3, in which a wafer 32 (shown in FIG. 1) including a plurality of sensor chips 10 is used as a sample. The producing method comprises the step of dissolving the sublimable material in the solvent to prepare the sublimable material solution, and the step of filling the sublimable material solution in the lead taking-out section 12 and the cavity 18. The sublimable material, in this instance, is naphthalene having a boiling point of 80.3° C. The solvent is isopropyl alcohol (referred to as "IPA"). The sublimable material solution have a weight ratio of naphthalene/IPA= 1/15 at which naphthalene is readily dissolvable in IPA at room temperature.

Figure 4:
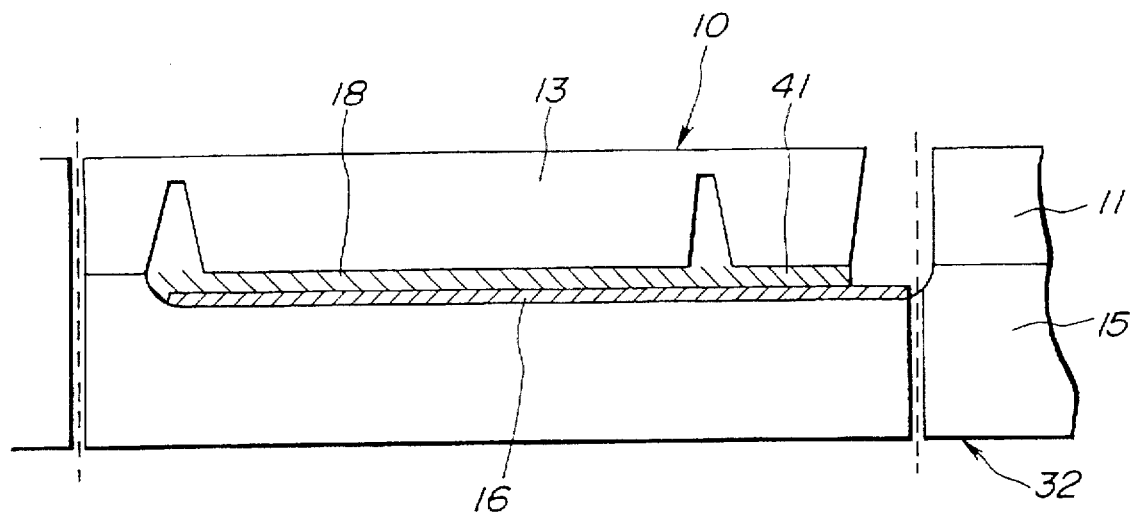
FIG. 4 is a vertical sectional view similar to FIG. 1 but showing the sensor in a stale produced by the producing method of FIGS. 2A to 2C.

As shown in FIGS. 2A and 2B, first a wafer 32 (also shown in FIG. 1) is set on a heater 31 which is set to have a surface temperature of at about 85° C., as indicated at a time point TA in FIG. 3. FIG. 3 shows change in temperature of the wafer 32 in terms of lapse of time. Then, the temperature (heating temperature) of the wafer substrate 32 is initiated to rise. Subsequently, the sublimable material solution or naphthalene/IPA solution 33 is dropped in an amount of about 0.08 ml per cm$^2$ of the wafer substrate surface, at the central part of the surface of the wafer 32 by using a pipette 34 as indicated at a time point TB in FIG. 3. At this time, the temperature of the wafer 32 momentarily lowers and immediately thereafter again rises as seen from FIG. 3. Here, as shown in FIG. 2C, a layer of naphthalene/IPA solution 33 is formed on the surface of the wafer 32, in which IPA in the solution layer preferentially vaporizes so that the naphthalene/IPA solution is concentrated. In this concentration upon heating (in a time duration TC in FIG. 3), the temperature of the naphthalene/IPA solution slightly lowers. As the concentration of the naphthalene/IPA solution 33 proceeds upon heating, the solution 33 reaches its saturated state so that naphthalene in solid phase crystallizes in the vicinity of the surface of the naphthalene/IPA solution layer. As indicated at a time point TD in FIG. 3, the temperature of the naphthalene/IPA solution again rises to initiate melting of the solid phase naphthalene. At 1 to 2 minutes after completion of fusion of the solid phase naphthalene, the wafer substrate 32 is removed from the heater 31 and allowed to stand at room temperature. It will be understood that with the above-discussed process, the cavity 18 of the sensor chip 10 is completely filled with crystal 41 of naphthalene as shown in FIG. 4.

Figure 5:
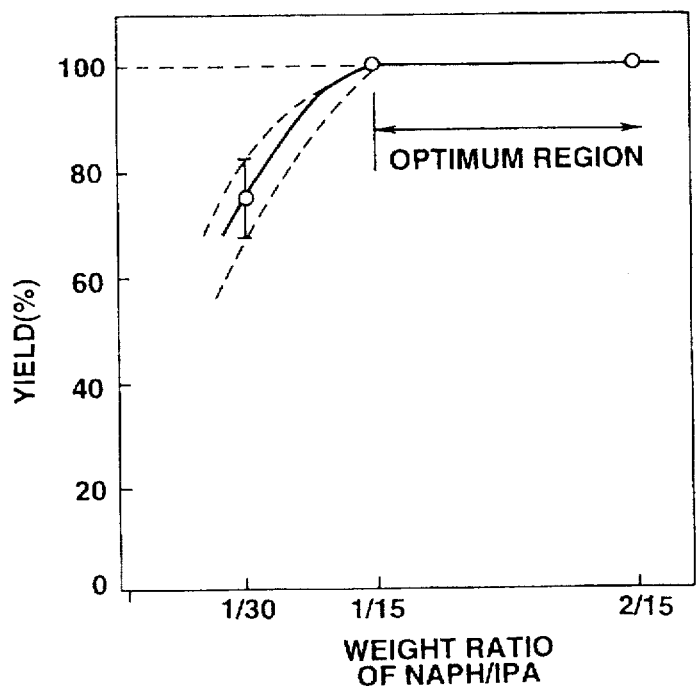
FIG. 5 is a graph showing the relationship between yield of the sensor of FIG. 4 and concentration of a sublimable material solution.
Figure 6:
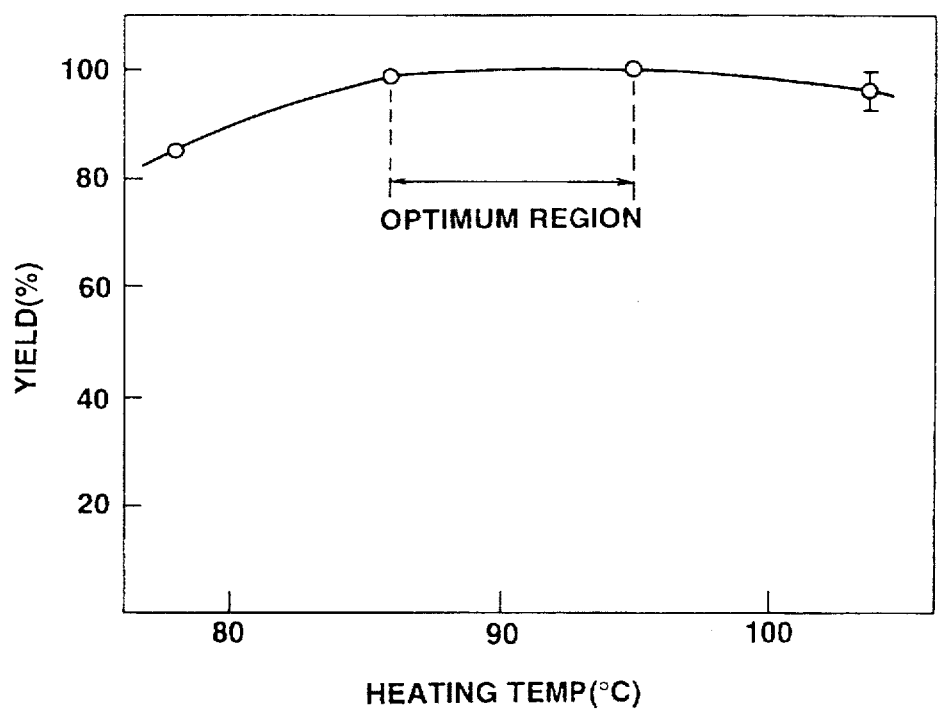
FIG. 6 is a graph showing the relationship between yield of the sensor of FIG. 4 and heating temperature for a substrate of the sensor.

In connection with the above first example producing method, the relationship between the concentration (weight ratio of naphthalene/IPA of saturated solution at room temperature) of the sublimable material solution and yield is shown in FIG. 5. Additionally, the relationship between heating temperature and yield is shown in FIG. 6. Here, the term "yield" means the probability (%) of production (appearance) of "good" chip (10) on the premise that the chip (10) whose cavity 18 was not filled with the sublimable material was called a "No Good" chip whereas the chip (10) whose cavity 18 is filled with the sublimable material is called the "good" chip. Determination as to whether the cavity 18 is filled with the sublimable material or not was achieved by observing the cavity 18 from the side of the glass mount (PYREX 7740) 15 of the wafer 32 by virtue of the fact that the glass mount 15 is transparent. The data of FIGS. 5 and 6 demonstrate that an optimum concentration of the sublimable substance solution is not less than naphthalene/IPA=1/15 (in weight ratio) as indicated as an optimum region in FIG. 5, and an optimum heating temperature is within a range of 85° to 95° C. as indicated as an optimum region in FIG. 6. It will be understood that about 100% of yield can be obtained in case of accomplishing the producing method of the first example in the condition of the above optimum regions.

In the wafer 32 produced by the above process, the naphthalene crystal 41 is filled in the cavity 18 of the wafer W. The naphthalene crystal 41 can be kept in the form of crystal for 8 hours or more even in an open system or open air at ordinary temperature and at normal pressure. Storage of the naphthalene crystal 41 for a further long period of time may be possible, for example, by a storage manner in which the wafer 32 with the naphthalene crystal 41 is stored in a hermetically sealed container, and another storage manner in which the same wafer 32 is stored under an equilibrium vapor pressure at a stored temperature, i.e., in a container in which a suitable naphthalene has previously existed. Storage of the wafer 32 with the naphthalene crystal 41 can be possible during a predetermined time period by the above storage manners, and therefore it has become unnecessary that a process of dicing is continuously followed by the process of filling the naphthalene to the cavity 18. At the dicing process, the wafer 32 in FIGS. 1 and 4 is cut or separated along dotted lines, for example, by a dicing saw (not shown) thereby to obtain the sensor chips 10. Thus, by using the hermetically sealed container, a semipermanent storage of the wafer 32 with the naphthalene crystal 41 may be possible. Additionally, in case that the dicing process requires a long time, the dicing process may be accomplished under the equilibrium vapor pressure of naphthalene as same as in the above storage manners.

It is to be noted that naphthalene is hydrophobic and therefore penetration of cooling water to the cavity 18 can be completely prevented during the dicing process while completely preventing damage of the movable section or beam (13) of the sensor chip 10.

The naphthalene crystal 41 filled in the cavity 18 can sublime to be completely removed upon being allowed to stand at room temperature, after completion of the dicing process. Heating may be used to promote the sublimation of the naphthalene crystal 41. For example, in case of heating at 150° C., removal of the naphthalene crystal 41 upon its sublimation can be completed within a time of 15 minutes. Otherwise, the effect of sublimation promotion may be obtained, for example, by causing air to flow through the naphthalene crystal or under vacuum.

Concerning naphthalene, high quality naphthalene (produced by Wako Pure Chemical industries, Ltd. in Japan) available on the market was subjected to an atomic absorption analysis in which a quantitative analysis was conducted to measure impurities (Na, K, Fe). The result of this analysis demonstrates that the content of Na, K and Fe as impurities are below their quantitative analysis limit values of 0.0002 wt %, 0.0003 wt % and 0.0005 wt %, respectively. Each quantitative analysis limit value is a value below which the quantitative analysis is impossible. Accordingly, it has been confirmed that inexpensive and high quality naphthalene reagents are readily available on the market. It will be understood that the above-discussed example producing method does not require any complicated device and therefore is inexpensive to practice the method.

While the above example producing method has been shown and described as employing a manner of concentrating the naphthalene/IPA solution upon heating to crystallize naphthalene, it will be appreciated that naphthalene may be crystallized by employing a recrystallization depending upon a temperature changing. Although only naphthalene has been shown and described as being used as the sublimable material in the above producing method, it will be understood that the naphthalene may be replaced with other materials which are solid at ordinary temperature and at normal pressure, such as camphor, p-dichlorobenzene, tetrachloro difluoroethane, terephthalic acid, isophthalic acid, trimesic acid or anthracene. In case that the sublimable material is brought into contact with water, for example, in the dicing process using water, the sublimable materials which are not reactive with and not soluble in water may be used. While only IPA has been shown and described as being used as the solvent for the sublimable material, it will be understood that the IPA may be replaced with other solvents in which the sublimable material is soluble and by which a good wettability of the constituent materials of the minute device or sensor chip 10 is provided, examples of the solvents being methanol, ethanol, butanol, acetone, benzene, carbon disulfide, carbon tetrachloride, chloroform, hexane, decalin, tetralin, xylene, acetic acid, cyclohexanol, toluene and ether.

In the above producing method, it will be appreciated that a section around the cavity 18 and the movable section 13 can be effectively protected from being damaged upon contacting with water or aqueous solution in a wet chemical-treatment process (such as a wet etching process) in which the minute device is in contact with water or aqueous solution, in addition to the above-mentioned dicing process. Furthermore, although the production method including the dicing process has been discussed in the above embodiment, it will be appreciated that the principle of the present invention may be applicable to a variety of processes during which it is required to temporarily protect the minute structure from its breakage, penetration of dust, sticking and/or the like, such processes including physical and mechanical treatment processes such as storing, transportation, assembling and grinding, and chemical treatment processes such as plating, rinsing and etching which require treatment of the minute structure with gas and/or chemicals.

Figure 7:
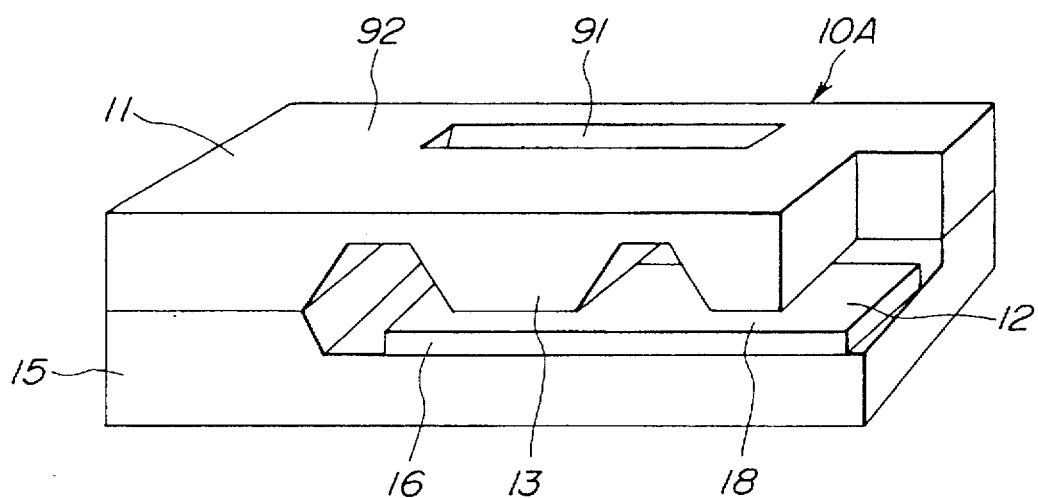
FIG. 7 is a schematic perspective view of a semiconductor capacitive acceleration sensor produced by a second example of the embodiment of the producing method according to the present invention, showing a basic arrangement of the sensor.

FIG. 7 illustrates a second example of the embodiment, in which the principle of the embodiment is applied to a producing method of a semiconductor capacitive acceleration sensor 10A of the type shown in FIG. 7. The sensor 10A is similar to that of FIG. 1 with the exception that the silicon substrate 11 is formed with an opening 91 and a thin beam section 92 for the purpose of improving a sensitivity of the sensor 10A, in which the weight 13 is supported by the beam section 92. The acceleration sensor 10A of such a structure requires to fill the opening 91 in addition to the cavity 18 with the subsumable material.

In this example producing method, which is similar to that shown in FIGS. 2A to 2C, a process of removing a slight amount of the naphthalene/IPA solution 33 is added to the producing method of FIGS. 2A to 2C, in which the solution 33 added on the surface of the wafer 32 in the process of coating the solution to the surface of the wafer 32 as shown in FIG. 2B is removed after the heat treatment shown in FIG. 2A. For example, as this removing process, the surface of the wafer 32 is blown to remove the solution 33, upon which a treatment of forming a surface protective film (not shown) on the surface of the wafer 32 or the like treatment can be made under a condition where naphthalene has been filled in the cavity 18. In case of using a UV (ultraviolet) tape (for example, tradename: D-702, produced by Lintec Cop. in Japan) as the surface protective film, the tape can be peeled off from the wafer 32 without hardly applying stress to the wafer 32 by merely applying ultraviolet rays to the UV tape because the UV tape loses its adhesion upon applying ultraviolet rays onto it. It will be appreciated that examples of the above-mentioned removing process include putting the wafer 33 with the solution 33 under vacuum, spinning the wafer 32 with the solution 33, and wiping the solution 33 on the wafer 32. It will be understood that such manners of the removing process can provide the same effects as those obtained by the above-mentioned blowing for removing the solution 33.

With the above additional process of removing the sublimable material solution, it becomes that both filling the cavity with naphthalene crystal and using the surface protective UV tape for the wafer 32 are carried out thereby completely preventing water and dust from penetrating through the cavity 18 and the opening 91 during dicing. It is to be noted that the filled naphthalene crystal and the wafer surface protective UV tape can be readily removable as discussed above. Other examples of the surface protective film are a protective sheet, a protective film or resist film, and a synthetic resin film. In case of using a liquid material such as resist or resin as the surface protective film, it may be assumed that there is the possibility of the resist or the resin penetrating into the cavity so that it is difficult to completely remove the resist or the resin from the inside of the cavity in a process of removing the resist or the resin made after; however, such a drawback can be overcome by applying the resist or the resin onto the surface of the wafer (32) whose cavity (18) has been already filled with naphthalene crystal (41), in which the resist or the resin cannot penetrate into the cavity thereby facilitating the removing process for the resist or the resin, carried out after.

While only the producing methods of the semiconductor acceleration sensor have been shown and described as examples, it will be appreciated that the principle of this embodiment may be applied to producing methods of other minute devices having a cavity or a movable section, such as a vibration gyro or the like disclosed in Japanese Patent Provisional Publication No. 4-242114.

Next, another embodiment of the producing method of the device having a minute structure, according to the present invention will be discussed hereinafter with reference to FIGS. 8 to 17.

According to the principle of this embodiment, the method of producing a device having a minute structure comprises the following steps in the sequence set forth below: (a) forming a film of a liquid containing a sublimable material on a surface of a product of the device, the sublimable material being solid at ordinary temperature and at normal pressure, the minute structure being formed at the surface of the product; (b) improving a wettability of at least one of the minute structure and a region surrounding the minute structure, by the liquid film of the sublimable material; (c) converting the liquid film into a state containing the sublimable material in solid phase so as to form a protective film; and (d) vaporizing the protective film to be removed.

In this case, the principle of this embodiment of the present invention is applied to a producing method of the minute device such as a semiconductor device or a semiconductor capacitive acceleration sensor.

In the producing methods of this embodiment, the difference in wettability of the surfaces of solids of the minute devices by liquids play an important role. The solid surface is constituted of, for example, aluminum or an oxide film. The liquid includes the molten liquid of the sublimable material such as naphthalene, and/or an organic solvent such as isopropyl alcohol (IPA). The molten liquid of the sublimable material is a liquid which is formed by melting the solid sublimable material under heating. The solid surface of the minute device is constituted of a variety of materials which include mainly an oxide film such as PSG (phosphosilicate glass) film, and wiring materials such as aluminum film. Here, for the purpose of simplicity, the wettability according to this embodiment will be discussed on a case that the solid surface portion is constituted of an aluminum film and an oxide film, and the liquids are IPA and the naphthalene molten liquid.

In general, the "wettability" means a phenomena that a liquid pushes away a gas (atmospheric air) from the surface of a solid. The brief explanation for the wettability is described, for example, in "Chemistry Encyclopedia" published in Kyoritsu Shuppan Kabushikikaisha (in Japan). Additionally, the phenomena of wetting is discussed, for example, in "Metal Physical Property Fundamental Lecture", 10th volume (Interface Physical Property), published by Maruzen (in Japan). The wettability of a solid surface by a liquid is determined according to the magnitude of a "contact angle" which is an angle relating to the liquid, of two angles which are formed between the surface of the solid surface and a tangent line of the surface of the liquid which line passes through a contact point (P) at which three phases (solid, liquid and gas) are in contact with each other. The wettability of the solid by the liquid is said "high" in case of the contact angle being small, whereas it is said "low" in case of the contact angle being large. The driving force of the phenomena of wetting corresponds to a decrease in free energy of wetting which is represented by a difference ($\sigma s - \sigma i$) between a solid-gas interfacial tension ($\sigma s$) and a solid-liquid interfacial tension ($\sigma i$). The following relationship resides between the difference ($\sigma s - \sigma i$) and the interfacial tension of the liquid ($\sigma 1$) in accordance with a balance in tension in a direction of the surface of the solid surface:

$$\sigma 1 \cos \theta = (\sigma s - \sigma i)$$

Additionally, the contact angle ($\theta$) is determined according to the balance between the work (Wa) of adhesion per unit area of the solid to the liquid and the work (Wc) of cohesion per unit area of the liquid, and therefore the contact angle ($\theta$) is represented by the following equation:

$$\cos\theta = \frac{2Wa}{Wc} - 1$$

Accordingly, in a system where the wettability is high, the force of adhesion of the solid to the liquid is over the force of cohesion of the liquid, so that the liquid smoothly expands on the surface of the solid. In a system where the wettability is high, the cohesion force of the liquid is over the adhesion force of the solid to the liquid, so that the liquid does not expand on the surface of the solid and is shaped ball-like.

As discussed above, since the surface portion of the minute device is constituted mainly of the materials of oxide films, the wettability of a region (in which the minute structure is formed) by the molten liquid of naphthalene is low, and therefore the naphthalene molten liquid cannot extend to form a thin film thereby being formed ball-like. Thus, in this state, it is impossible to coat the region in which the minute structure is formed, with naphthalene. However, the molten liquid of naphthalene can expand on the surface of aluminum to form a thin film, so that it is possible to coat the region of aluminum with naphthalene.

Attention should be paid to the fact that the behavior of the liquid (naphthalene molten liquid) as one cohered body is determined in accordance with the state of the contact point of the three phases, i.e., the solid (the region in which the minute structure is formed, the aluminum region and the oxide film region), the liquid (the naphthalene molten liquid) and the gas (atmospheric air). By virtue of a position of the contact point (a closed curve in practice) of the three phases (solid, liquid and gas), naphthalene is expanded on the region in which the minute structure is formed in FIG. 8D in a first example of this embodiment. In case that the contact point of the naphthalene molten liquid resides in the region having the minute structure or in the oxide film region near the substrate, the cohesion force of the naphthalene molten liquid is over the adhesion force, so that the naphthalene molten liquid intends to decrease its surface area upon cohesion. In case that the contact point of the naphthalene molten liquid resides in the aluminum region surrounding the region having the minute structure, the adhesion force of the naphthalene molten liquid is over the cohesion force, so that the naphthalene molten liquid intends to wet the surface of the solid upon extending. As a result of such a quarrel, the contact point of the naphthalene molten liquid is pinned at a most-outer peripheral portion of the aluminum region surrounding the region having the minute structure and at a most-inner peripheral portion, i.e., at the border between the aluminum region surrounding the region having the minute device and the oxide film region surrounding the aluminum region. This state is thermodynamically metastable, in which if the contact point of the three phases (solid, liquid and gas) is developed at the region having the minute device, the naphthalene molten liquid is smoothly converted to a state where it is divided into a plurality of ball-like fragments, for example, in case that bubbles arise from the inside of the minute structure.

In practice, the amount of the liquid to be used in examples discussed after is not so small as to form a minute liquid drop whose gravity is negligible. Additionally, a surface portion in which the minute structure is formed has a complicated structure. Accordingly, both wetting and capillary phenomenon occur on the same cohered liquid. Further, pressure distribution within the liquid is in complicated relation to stress and the like of members constituting the minute device. As a result, it is very difficult to definitely discuss "wetting" phenomena, and therefore the wetting phenomena will be qualitatively summarized in Table 1.

sented respectively as "high" and "small", more specifically it may be preferable that they are represented by a adhesion tension or difference (σs–σi) between the solid-gas interfacial tension (σs) and the solid-liquid interfacial tension (σi) upon the contact point (θ) being assumed zero. The wettability of a structure having capillaries in the minute device is judged high if the solid-gas interfacial tension (σs) is over the solid-liquid interfacial tension (σi), in which wetting of the structure spontaneously proceeds like liquid soaks into a porous material so that the surface tension itself of the liquid is negligible according to occasions.

Hereinafter, the first example of this embodiment will be discussed in the concrete with reference to FIGS. 8A to 8E, in which a solid film of the sublimable material is formed as a temporary surface protective film on the minute device. In this example, the principle of the embodiment is applied to the producing method of a minute device or semiconductor device S which has a semiconductor element or minute structure (no numeral) formed on a semiconductor substrate 100.

Figure 8A:
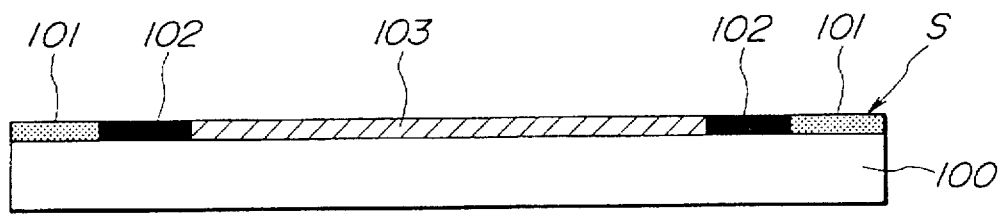
FIGS. 8A to 8E are schematic sectional views showing the procedure of a first example of another embodiment of the producing method according to the present invention, by which a temporary protective film is formed on a surface of a substrate.

First, as shown in FIG. 8A, the semiconductor substrate 100 is heated, in which the heating temperature may be low but higher than the melting point of the sublimable material to be used. The heating temperature is possible to be up to the boiling point of the sublimable material. Here, the minute device S has a region 103 in which the semiconductor element is formed, a region 102 of aluminum surrounding the region 103, a region 101 of oxide film surrounding the aluminum region 102. It will be understood that, more specifically, the minute device S in FIG. 8A is the semi-finished product to which any physical treatment is to be applied in order to obtain the finished product of the minute device S.

Figure 8B:
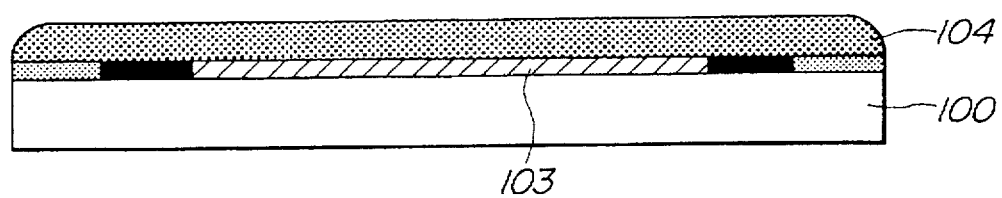

Secondly, as shown in FIG. 8B, the naphthalene molten liquid is dropped on the surface of the surface of the minute device S, in an amount sufficient to cover the aluminum region 102, thereby forming a layer 104 of the naphthalene molten liquid. Here, the wettability of the region 103 having the semiconductor element by the naphthalene molten liquid is low. Accordingly, in case that the amount of the naphthalene molten liquid to be dropped is small, the region 103 having the semiconductor element cannot be covered with the naphthalene molten liquid like water is dropped on the surface of a pan. In case that the amount of the naphthalene molten liquid to be dropped increases to reach a certain level, a liquid film (having the same area size as the semiconductor substrate 100) of the naphthalene molten liquid is maintained on the minute device S under the action

TABLE 1

| LIQUID<br>SOLID SURFACE | IPA<br>Al | IPA<br>OXIDE FILM | LIQUID NAPHTHALENE<br>Al | LIQUID NAPHTHALENE<br>OXIDE FILM |
|---|---|---|---|---|
| WETTABILITY | HIGH ← | | | → LOW |
| CONTACT ANGLE | | | | |
| ( COHESION FORCE / ADHESION FORCE ) | SMALL | | | → LARGE |
| FILM STATE OF LIQUID | VERY SMOOTHLY EXPANDING TO FORM A THIN FILM | SMOOTHLY EXPANDING TO FORM A THIN FILM | EXPANDING TO FORM A THIN FILM | NOT EXPANDING TO BE SHAPED BALL-LIKE |

In the above Table 1, although the wettability and contact angle of the system including IPA is qualitatively represented of surface tension of the naphthalene molten liquid. Of course in case that the naphthalene molten liquid to be dropped is too much, the naphthalene molten liquid overflows the surface of the minute device S. It will be understood that an optimum amount of the naphthalene molten liquid to be dropped is determined according to the area size of the semiconductor substrate 100 and to the wettability of the oxide film region 101 by the naphthalene molten liquid.

Figure 8C:
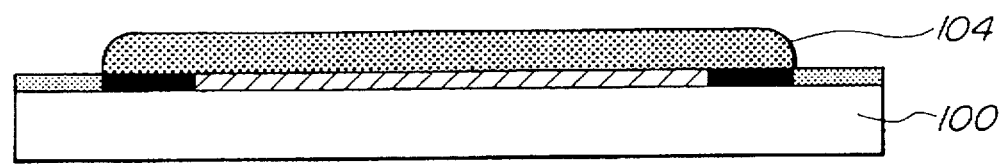

Thirdly, as shown in FIG. 8C, the naphthalene molten liquid in the form of the layer 104 on the minute device is decreased under vaporization. The wettability of oxide film by the naphthalene molten liquid is low, and therefore the area of the bottom surface of the layer 104 of the naphthalene molten liquid is gradually decreasing until the outer periphery of the layer 104 reaches the border between the oxide film region 101 and the aluminum region 102 under a condition where a large contact angle of the layer 104 is maintained.

Figure 8D:
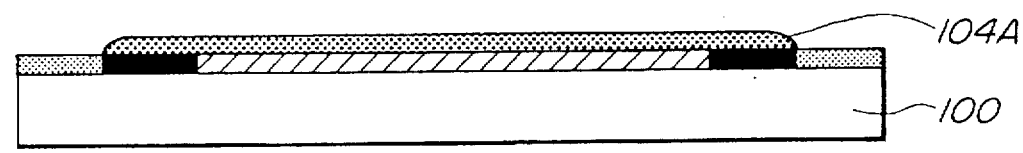

Fourthly, as shown in FIG. 8D, the naphthalene molten liquid of the layer 104 is further decreased under vaporization. The wettability of aluminum by the naphthalene molten liquid is high, and therefore the area of the bottom surface of the layer 104 of the naphthalene molten liquid is gradually decreasing until the outer periphery of the layer 104 reaches the border between the oxide film region 101 and the aluminum region 102 under a condition where a large contact angle of the layer 104 is maintained. Thereafter, the contact angle is gradually decreasing in a condition where the outer periphery of the bottom surface of the layer 104 is kept aligned with the outer-most periphery of the aluminum region 102.

Figure 8E:
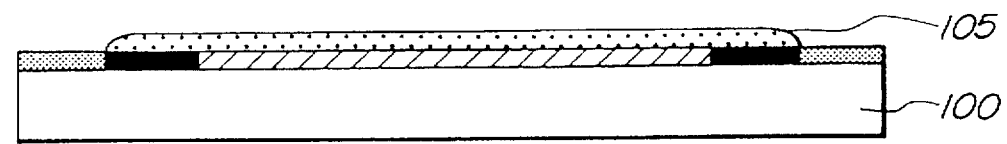

Lastly, as shown in FIG. 8E, the above layer 104 of the naphthalene molten liquid becomes a liquid film 104A. When the naphthalene molten liquid in the liquid film 104A is decreased to a suitable level at which the thickness of the liquid film 104A is, for example, 100 µm, the minute device S is cooled to convert the liquid film 104A to a semitransparent solid coat film (temporary protective film) 105 of naphthalene.

While the above example has been shown and described as being for producing such an arrangement that the aluminum region 102 surrounding the region 103 having the semiconductor element or minute structure is formed at the outer peripheral portion of the substrate 100 of the semiconductor device or chip S, it will be appreciated that the aluminum region 102 may be formed surrounding each chip or a plurality of chips. The aluminum region 102 may not be formed on the substrate 100 and may be formed on a jig (not shown) for the substrate 100. The aluminum for the region 102 may be replaced with other metals having a high wettability by the molten liquid of the sublimable material, so that a variety of metals are used in place of aluminum. The jig may not be used to surround each substrate and may be used to surround a plurality of the substrates. In case of using such a jig, other liquid may be poured in the clearance between the jig and the substrate in order to prevent the sublimable material from penetrating into the clearance under a capillary phenomenon. The oxide film region 101 may be replaced with other materials having a wettability by the molten liquid of the sublimable material, and therefore a region of "Teflon (tradename of polytetrafluoroethylene)" resin may be used as the material and may not be formed on the substrate so as to be formed on a jig for the substrate.

Although the naphthalene molten liquid has been shown and described as being dropped onto the surface of the minute device in the above example, it will be understood that the naphthalene molten liquid may be replaced with a naphthalene solution which is prepared by dissolving solid naphthalene in a solvent. Such naphthalene solution may not be liquid at room temperature and therefore may be a heated concentrated solution having a concentration higher that a level at a saturated state (at room temperature). In this case, the solvent may be selectively vaporized to concentrate the sublimable material solution after dropping of the solution.

While the layer 104 of the naphthalene molten liquid has been shown and described as being formed by dropping the naphthalene molten liquid upon heating the semiconductor substrate 100, it will be appreciated that it may be formed by heating the substrate 100 upon dropping the naphthalene molten liquid, or otherwise it may be formed by scattering naphthalene powder on the surface of the semiconductor substrate 100 and thereafter heating the naphthalene powder to melt it. It is a matter of course that the naphthalene powder may be adhered onto the surface of the substrate under an electrostatic force, followed by heating to be molten.

It will be appreciated that heating the semiconductor substrate 100 may be carried out by using a heater or other heating devices. While only naphthalene has been shown and described as being used as the sublimable material, it will be understood that the sublimable material may be materials which are solid at ordinary temperature and normal (atmospheric) pressure and sublimable, such as p-dichlorobenzene, tetrachloro difluoroethane. The sublimable material may be camphor which is soluble in water, as occasion demands. The sublimable material may be formed of a single material and may be formed of a plurality of materials (for example, a mixture of two different sublimable materials, or a mixture of a sublimable material and a surface or interfacial active agent). The sublimable material may contain an organic solvent so as to exhibit a depression of freezing point. The temporary protective film (105) may not be completely solid and therefore may be generally solid and porous in which liquid coexists.

Although decreasing the amount of naphthalene molten liquid in the layer 104 at the processes of FIGS. 8B and 8C has been shown and described as being accomplished under vaporization, it will be appreciated that the amount of naphthalene molten liquid may decreased by sucking up the naphthalene with a sucking-up device. As occasion demands, only an amount of naphthalene molten liquid necessary for forming the liquid film 104A at the process of FIG. 8D may be dropped on the surface of the minute device S, followed by extending the liquid film to the aluminum region 102 under the action of acceleration or the like. Such extending the liquid film under the action of acceleration may be effective in case the naphthalene molten liquid unavoidably overflows the substrate before the naphthalene layer 104 is formed covering the whole of the upper surface of the substrate 100 at the process of FIG. 8B, for the reason why the wettability of the region 103 (in which the minute structure is formed) by the naphthalene molten liquid is extremely low.

The aluminum region 103 surrounding the region 103 (in which the minute structure is formed) may not be formed completely continuous or endless, and therefore may include a plurality of pieces which are separate by a predetermined distance from adjacent ones. Similarly, the oxide film region 101 may not be formed completely continuous or endless, and therefore may includes a plurality of pieces which are separate by a predetermined distance from adjacent ones.

9A to 9E show an example of manner of dicing to be used in cooperation with the above-discussed producing method of FIGS. 8A to 8E.

Figure 9A:
FIGS. 9A to 9E are schematic sectional views showing the procedure of a dicing in connection with the producing method of FIGS. 8A to 8E.

First, as shown in FIG. 9A, the semiconductor element or minute structure is formed in an upper surface portion of a semiconductor substrate 1 by using a semiconductor element forming process such as a photo-fabrication or photolithographic technology, or a micromachining technology.

Figure 9B:

Secondly, as shown in FIG. 9B, the temporary protective film 105 of naphthalene is formed on an upper surface portion (including the semiconductor element or minute structure) of the semiconductor substrate 1 by the same processes as shown in FIGS. 8A to 8E, thus forming a structure S1.

Figure 9C:
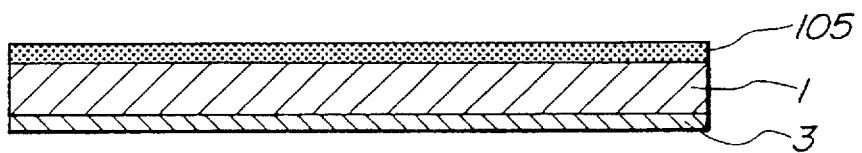

Thirdly, as shown in FIG. 9C, a mount tape 3 is applied to the lower surface of the substrate 1.

Figure 9D:
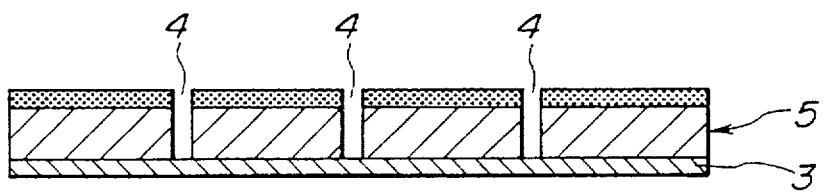

Fourthly, as shown in FIG. 9D, the structure S1 is divided into a plurality of chips 5 by dicing with a diamond grinder (not shown) to form cuts 4.

Figure 9E:
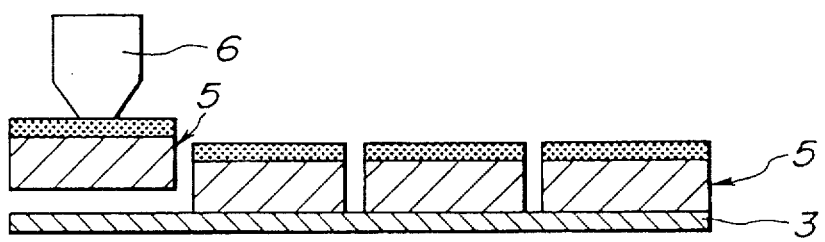

Lastly, as shown in FIG. 9E, each chip 5 is taken away with a picking-up device 6.

It will be understood that the protective film of the solid sublimable material can be completely removed upon sublimation thereof only by allowing each chip 5 to stand, without leaving a residue. Removal of the protective film may be promoted under heating or under vacuum, if necessary.

FIGS. 10A to 10E show an example of application of the above producing method of FIGS. 8A to 8E to a producing method of a surface type micromachine such as an infrared ray sensor of the thermally isolated structure is produced. FIGS. 10A to 10E respectively correspond to FIGS. 8A to 8E.

Figure 10A:
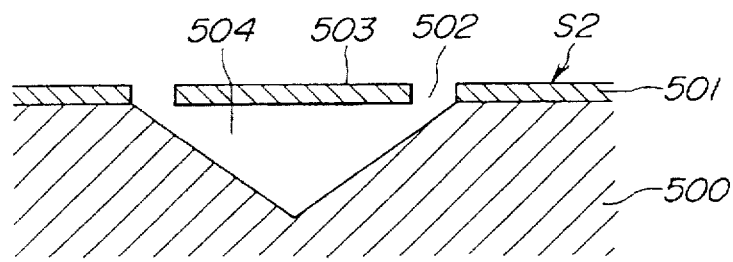
FIGS. 10A to 10E are schematic sectional views showing the procedure of a producing method for an infrared ray sensor, to which the principle of the first example of FIGS. 8A to 8E is applied.

At a process of FIG. 10A, a silicon substrate 500 is formed at its upper surface portion with an infrared ray sensor element (not identified), thereby producing the infrared ray sensor (more specifically, the semi-finished product of the sensor) S2. The infrared ray sensor includes a silicon nitride film 501, an etching opening 502 through which a cavity 504 is formed by alkali anisotropic etching, and a diaphragm 503 of silicon nitride film which is thermally isolated. Here, in general, the size of the diaphragm 503 is from about several tens μm to several hundreds μm; the size of the etched opening 502 is from about several μm to several tens μm. In practice, a thermocouple, an infrared ray absorption section or the like is formed on the diaphragm 503; however, explanation of such a device is not necessary here and therefore has been omitted for the purpose of simplicity of illustration.

Figure 10B:
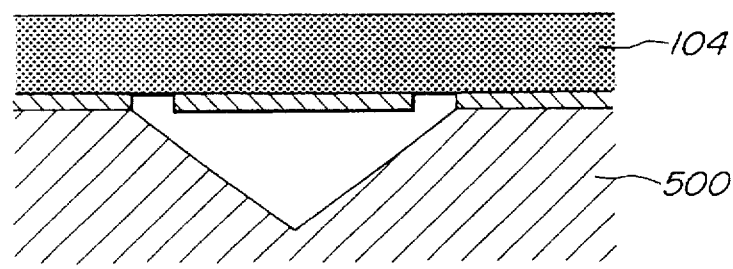
Figure 10C:
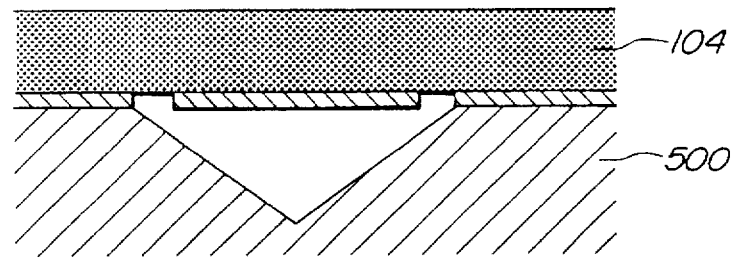

At processes of FIGS. 10B and 10C, when the layer 104 of naphthalene molten liquid is formed on the surface of the substrate 500, the naphthalene molten liquid cannot penetrate into the cavity 504 through the etching opening 502 having a dimension of several tens μm since the wettability of silicon and silicon nitride film constituting the infrared ray sensor by the naphthalene molten liquid is low.

Figure 10D:
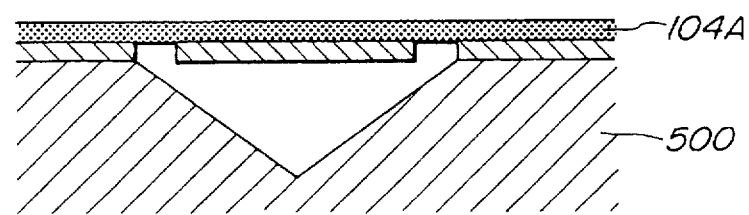

At a process of FIG. 10D, even when the amount of the naphthalene molten liquid in the layer 104 decreases and the thickness of the layer 104 reduces to form the film 104A of the naphthalene molten liquid, the film 104A extended on the region in which the infrared sensor element is formed can be maintained. This is because the infrared ray sensor of this embodiment is provided with the aluminum region 102 which has a high wettability by the naphthalene molten liquid, though not shown, in which the naphthalene molten liquid is extended by virtue of existence of the aluminum region 102. If the aluminum region 102 is not provided, the naphthalene molten liquid will be formed into a plurality of ball-like segments and gradually decreases like a slight amount of water on the surface of a pan is evaporated upon heating.

Figure 10E:
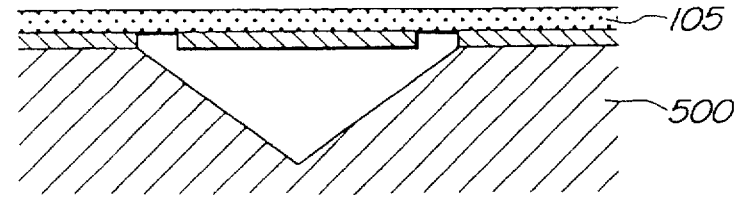

At a process of FIG. 10E, when the liquid film 10A in the state covering the region having the infrared ray sensor element is cooled, a solid film 105 of naphthalene is formed as a temporary protective film.

Next, a second example of this embodiment of the producing method according to the present invention will bed discussed with reference to FIGS. 11A to 11F. In this example, discussion will be made on a case in which the naphthalene molten liquid overflows the substrate 100 before the layer 104 of the naphthalene molten liquid is formed to cover the whole upper surface (including the minute structure 103) of the substrate 100 when the naphthalene molten liquid is dropped on the upper surface of the substrate 100, for the reason why the region having the minute structure 103 has a very low wettability by the naphthalene molten liquid. Such a case corresponds to a case in which the main part constituting the surface of the minute structure is made of silicon oxide film.

Figure 11A:
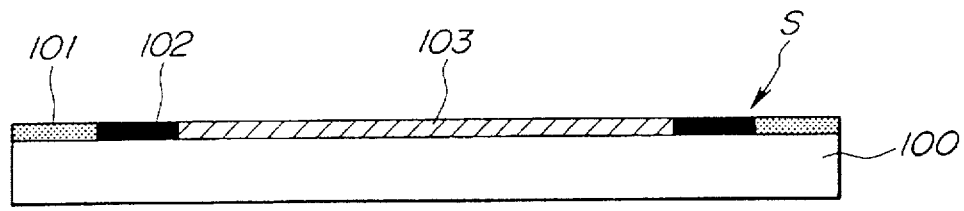
FIGS. 11A to 11F are schematic sectional views showing the procedure of a second example of the embodiment of the producing method according to the present invention, by which a temporary protective film is formed on a substrate.
Figure 11B:
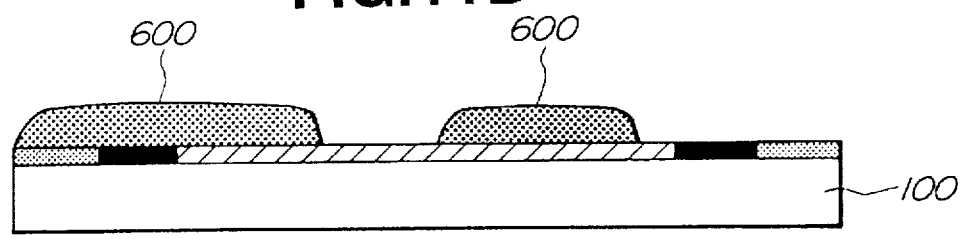

First, as shown in FIG. 11A, heating is made on the semiconductor substrate 100 of the minute structure (more specifically, the semi-finished product of the structure) S which is formed with the semiconductor element or minute structure 103.

Secondly, as shown in FIG. 9B, a suitable amount of the naphthalene molten liquid is dropped on the upper surface portion (including the minute structure 103) of the substrate 100 thereby forming a plurality of separated island-like liquid puddles 600.

Figure 11C:
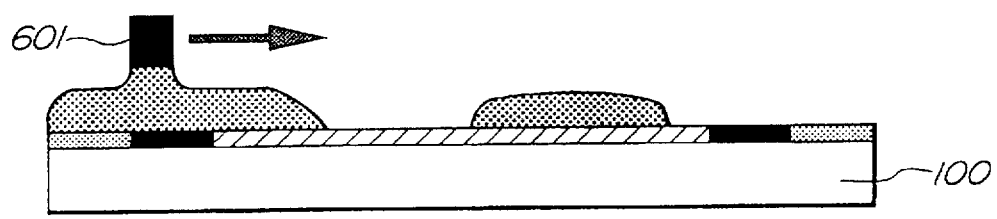

Thirdly, as shown in FIG. 11C, the liquid paddles 600 are coated on the surface of the substrate 100 by moving a member 601 (for example, a metal wire) having a high wettability by the naphthalene liquid, in a scan-like manner.

Figure 11D:
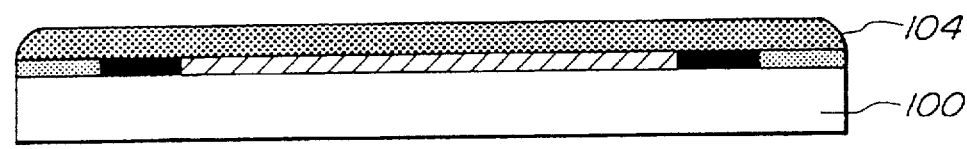

Fourthly, as shown in FIG. 11D, by the process of FIG. 11C, the liquid puddles 600 of the naphthalene molten liquid are joined with each other thereby to form the layer 104 of the naphthalene molten liquid.

Figure 11E:
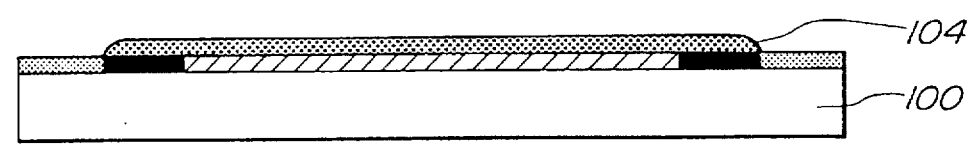

Fifthly, as shown in FIG. 11E, the amount of the naphthalene molten liquid in the layer 104 is decreased under evaporation of the naphthalene molten liquid.

Figure 11F:
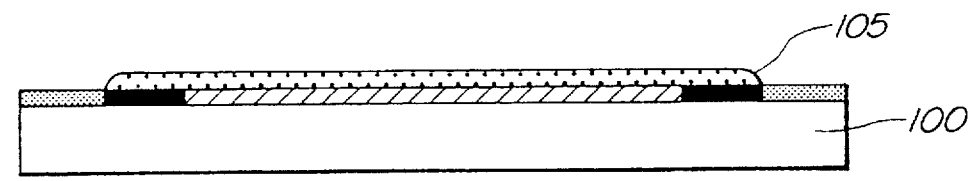

Lastly, as shown in FIG. 11F, when the thickness of the naphthalene molten liquid layer 104 reduces to a suitable level such as 100 μm, the substrate 100 with the layer 104 is cooled to form the layer 104 into a semi-transparent solid film 105 as a temporary protective film.

It will be appreciated that the principle of the second example may be applied to the first example of FIGS. 8A to 8E, in which it is sufficient that the napthalene molten liquid is dropped in such an amount generally corresponding to that of the naphthalene solid film 105 thereby extremely shortening a time required for vaporization and reduction of the naphthalene molten liquid in the processes shown in FIGS. 8C and 8D.

A third example of this embodiment of the producing method according to the present invention will be discussed with reference to FIGS. 12A to 12F and 13A to 13F. In this example, the producing method of FIGS. 12A to 12F is similar to that of FIGS. 8A to 8E, and the producing method of FIGS. 13A to 13F is similar to that of FIGS. 10A to 10E. It will be understood that the sublimable material (naphthalene) cannot be filled into the cavity by the producing methods of FIGS. 8A to 8E and FIGS. 10A to 10E. In this regard, according to this example, the sublimable material is not only coated on the surface of the substrate but also filled into the cavity in producing processes of the minute device, which is required, for example, in case that a dicing saw passes through the cavity of the substrate during dicing of a wafer. In this example, the processes of FIGS. 12A to 12F correspond respectively to the processes of FIGS. 13A to 13F.

Figure 12A:
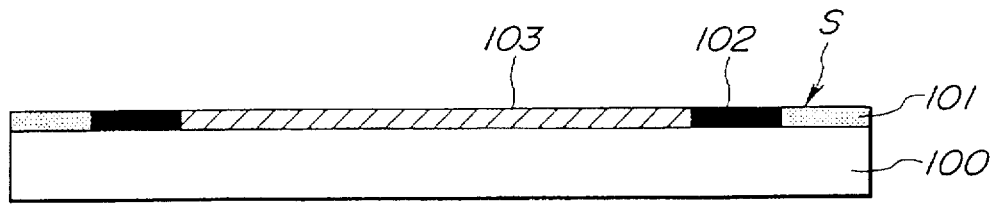
FIGS. 12A to 12F are schematic sectional views showing the procedure of a third example of the embodiment of the producing method according to the present invention, which is similar to the procedure of FIGS. 8A to 8E.
Figure 13A:
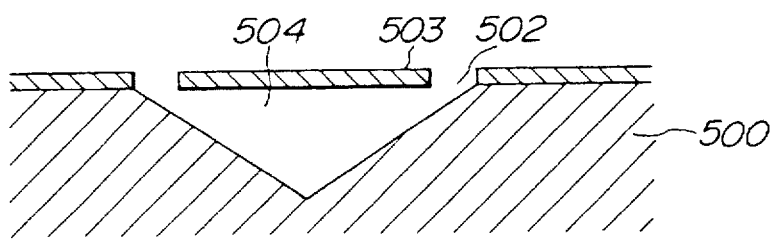
FIGS. 13A to 13F are schematic sectional views showing the procedure of the third example of the embodiment of the producing method according to the present invention, which is similar to the procedure of FIGS. 10A to 10E.

First, as shown in FIGS. 12A and 13A, the semiconductor substrate 100 formed with the semiconductor element or minute structure (103) is heated in this case, preferably at a temperature not lower than the melting point of naphthalene and not higher than the melting point of IPA (isopropyl alcohol). In FIG. 12A, 101 designates the oxide film region, and 102 designates the aluminum region.

Figure 12B:
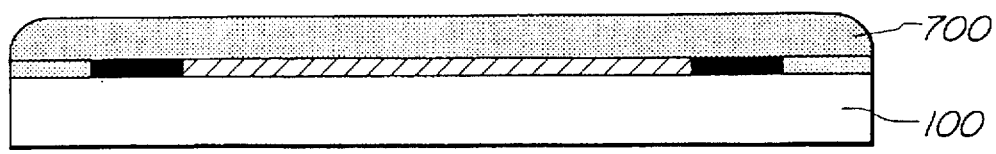
Figure 12C:
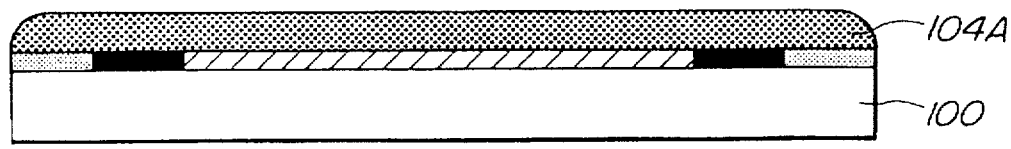
Figure 12D:
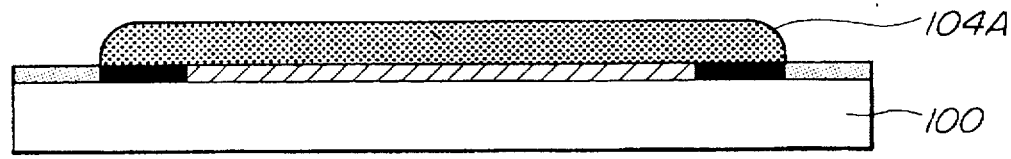
Figure 12E:
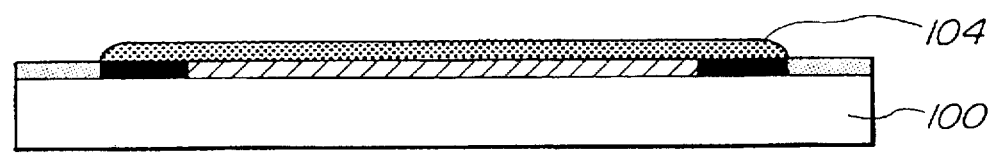
Figure 12F:
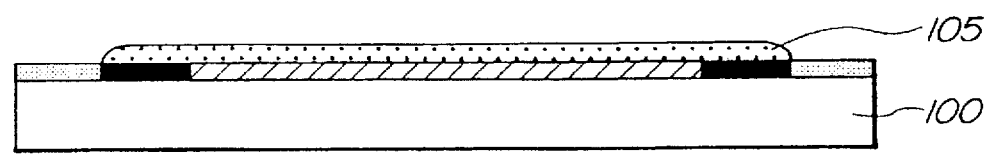
Figure 13B:
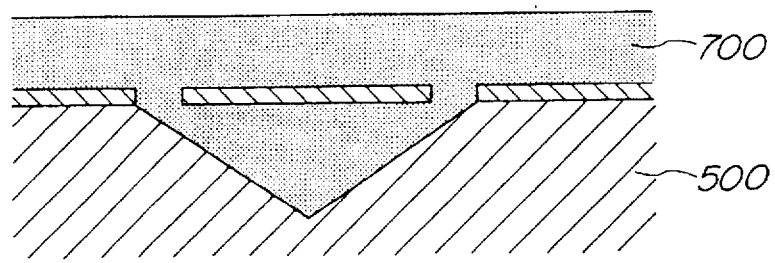

Secondly, as shown in FIGS. 12B and 13B, a suitable amount of IPA is dropped on the upper surface (including the semiconductor element 103 in FIG. 12A, or the semiconductor element having the opening 502, the cavity 504 and the diaphragm 503) of the substrate 100, 500 thereby forming a liquid film 700 of IPA. The materials constituting the semiconductor element have a high wettability by IPA, and therefore IPA penetrates through the opening 502 into the cavity 504 for etching so that air within the cavity 504 is replaced with IPA in the producing method of FIGS. 13A to 13F, which is similar to the producing method of FIGS. 12A to 12F. In this case, the oxide film region 101 surrounding the aluminum region 102 is provided to prevent IPA from overflowing the substrate 100, 500 because of a high wettability of aluminum by IPA. Assuming that the oxide film region 101 is not provided, formation of the IPA liquid film may be impossible.

Figure 13C:
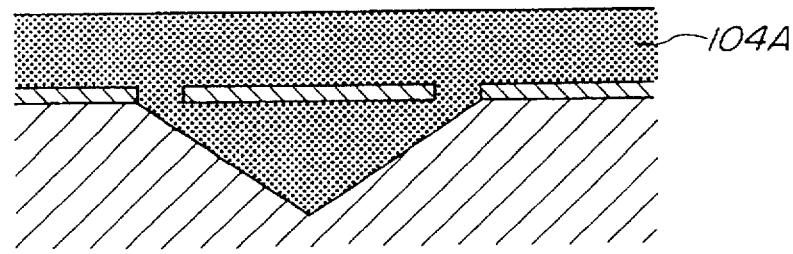
Figure 13D:
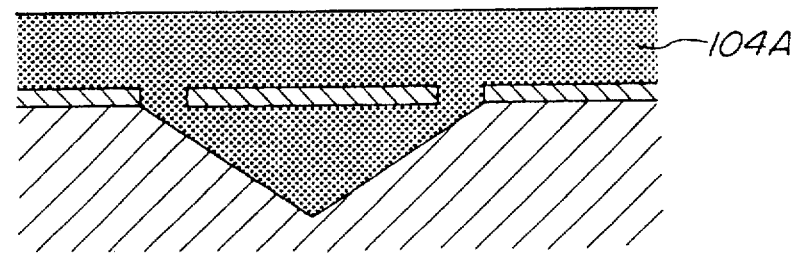
Figure 13E:
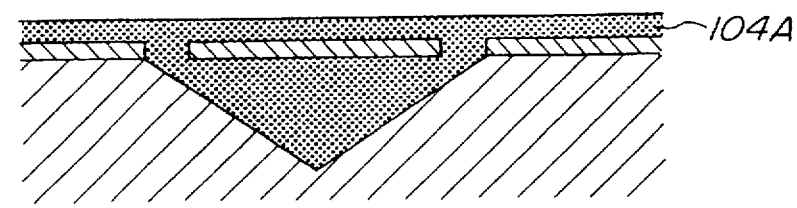

Thirdly, as shown in FIGS. 12C and 13C, the naphthalene molten liquid is dropped onto the IPA liquid film 700 thereby to form a layer 104A of the naphthalene molten liquid. At this time, the dropped naphthalene molten liquid can be dissolved in the IPA liquid film 700. Diffusion is made between the naphthalene molten liquid and the IPA liquid film 700 so that IPA within the cavity 504 in the producing method of FIGS. 13A to 13F is gradually replaced with the naphthalene molten liquid, which is similar to the producing method of FIGS. 12A to 12F.

Fourthly, as shown in FIGS. 12D and 12E and FIGS. 13D and 13E, the amount of the naphthalene molten liquid layer 104A is decreased under vaporization of the layer 104. At this time, vaporization of IPA occurs prior to that of naphthalene so as to lower the concentration of IPA both within the liquid layer 104A and the cavity 504.

Figure 13F:
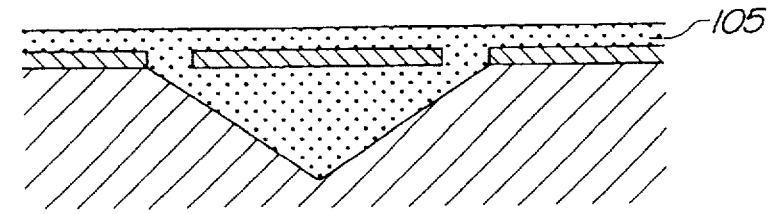

Lastly, as shown in FIGS. 12F and 13F, when the thickness of the naphthalene molten liquid layer 104A is decreased to a suitable level such as 100 μm, the substrate 100, 500 with the naphthalene molten liquid layer 104A is cooled thereby forming the naphthalene molten liquid layer 104A into a semi-transparent naphthalene solid film 105 as the temporary protective film. At this time, the naphthalene molten liquid 104A or 104 within the cavity 504 is solidified.

While IPA has been shown and described as being used as a solvent for the sublimable material in the above example, it will be understood that IPA may be replaced with other solvents which can dissolve the sublimable material to be used and have a characteristics that the wettability of the materials constituting the minute structure or device by the solvent is high, examples of the solvents being methanol, ethanol, acetone, benzene and the like. Each of the solvents is usually used singly, but a plurality of the solvents may be used together upon forming a mixed solvent. Otherwise, the single solvent or the mixed solvent may contain the sublimable material.

Figure 14A:
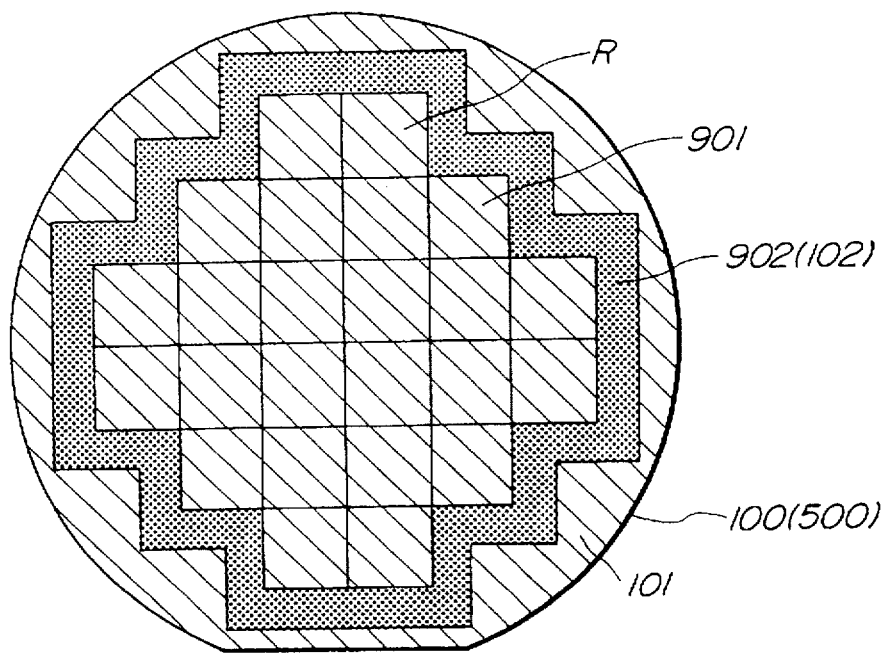
FIG. 14A is a plan view of a wafer, showing an example of the pattern of an aluminum region formed on the wafer, in connection with the embodiments of FIGS. 8A to 13F.

FIG. 14A illustrates an example of a pattern shape of the aluminum region 102 surrounding the region 102 in which the semiconductor element is formed, to be used in the above examples of this embodiment. FIG. 14A is a plan view of the upper surface portion (including the semiconductor element) of the substrate 100, 500. The aluminum region 102 surrounds a region R in which a plurality of chips 901 are formed, the region R corresponds to the region 103 (in FIGS. 8A to 8E) in which the semiconductor element or minute structure is formed. The aluminum region 102 is formed by disposing an integral pattern 902 of aluminum. The integral pattern 902 may be replaced with a plurality of aluminum sheets (pieces) arranged like the pattern 901, in which each aluminum sheet has a size of ¼ of each chip 901.

Figure 14B:
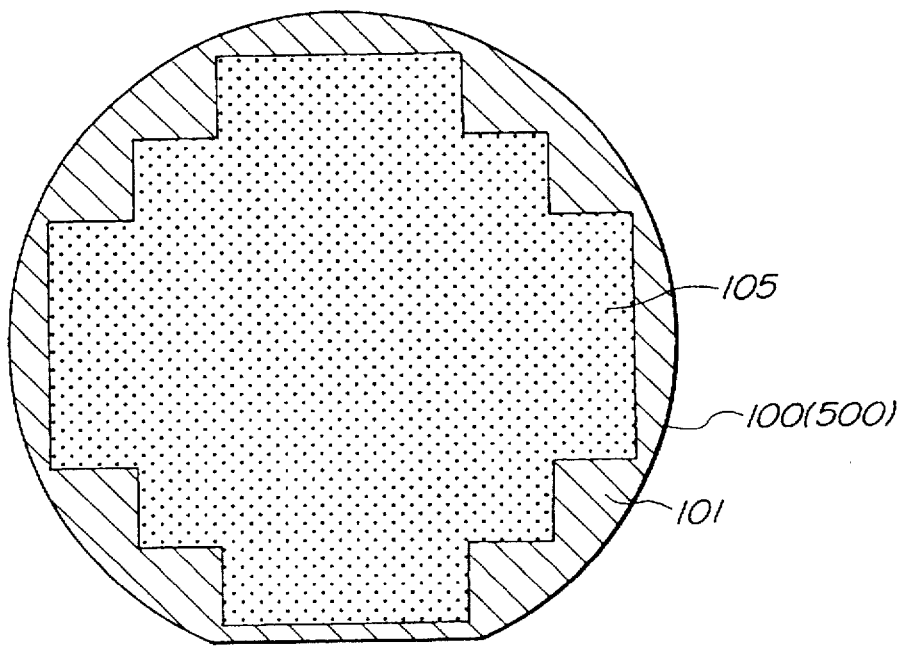
FIG. 14B is a plan view of the wafer, showing the pattern of the temporary protective film formed on the wafer by using the aluminum region of FIG. 14A.

According to the producing methods of the examples of this embodiment, the naphthalene solid film 105 is formed on the surface of the substrate 100, 500. As a result, the naphthalene solid film 105 is formed as shown in FIG. 14B in which the outer-most periphery of the naphthalene solid film 105 is aligned with that of the aluminum region 102.

Figure 15A:
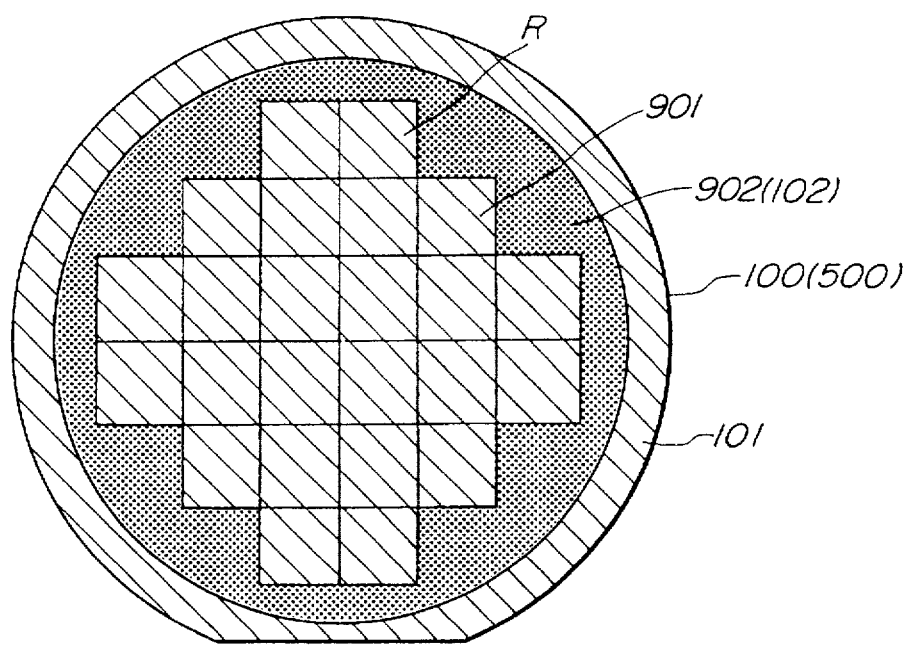
FIG. 15A is a plan view similar to FIG. 14A but showing another example of the pattern of the aluminum region.
Figure 15B:
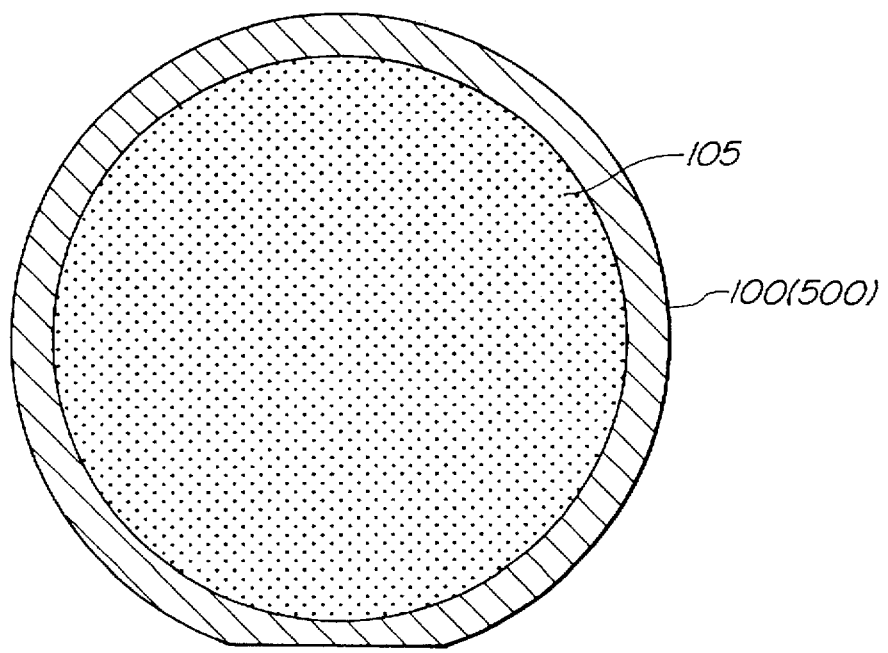
FIG. 15B is a plan view similar to FIG. 14B but showing the pattern of the temporary protective film formed on the wafer by using the aluminum region of FIG. 15A.

FIGS. 15A illustrates another example of the pattern shape of the aluminum region 102. In this example, the pattern shape has a circular outer-most periphery. Accordingly, the naphthalene solid film 105 formed on the substrate 100, 500 has a circular outer-most periphery corresponding to that of the aluminum region 102, as shown in FIG. 15B. It will be appreciated that the pattern-shape of the aluminum region 102 may have an oval outer-most periphery or other smoothly curved lines.

Hereinafter, a fourth example of this embodiment of the producing method according to the present invention will be discussed with reference to FIGS. 16 and 17A to 17D. With this example producing method, a minute device 100B having a basic structure shown schematically in FIG. 16 is produced. The minute device 100B includes a minute structure 200 formed of polysilicon. The minute structure 200 is fixedly supported on a silicon substrate 201. The minute structure 200 has a base section 202 through which the minute structure 200 is fixed to the silicon substrate 201. The minute structure 200 further has a movable section 203 integral with the base section 202 and separate from the upper surface of the silicon substrate 201, forming a gap 204 therebetween. A variety of micromachines include the above basic structure as a main part, incorporated in other structures (not shown). The minutes structure 200 is, for example, formed upon forming an oxide film as a sacrifice layer which is etched or removed under the action of an oxide film etching liquid after the formation of the minute structure 200, though not shown.

In this example producing method, the principle of the embodiment is applied no a drying process after the etching process of the sacrifice layer for the minute structure 200. This drying process will be discussed hereinafter.

First, as shown in FIG. 17A, the minute device (more specifically, the semi-finished produce of the device) 100B is dipped in pure water.

Secondly, as shown in FIG. 17B, the minute device 100B is dipped in IPA 211 in a vessel, so that pure water 209 is replaced with IPA 211.

Thirdly, as shown in FIG. 17C, the semi-finished product of the minute device 100B is dipped in the naphthalene molten liquid in a vessel so that IPA 211 is replaced with the naphthalene molten liquid. Then, the minute device 100B is raised from the the naphthalene molten liquid in the container thereby to solidify the naphthalene molten liquid covering the minute structure 200 thus forming a solid film 212 of naphthalene.

Lastly, as shown in FIG. 17D, the solid naphthalene can evaporate merely upon allowing to stand the semi-finished product with the naphthalene solid film 212, thereby obtaining the minute device or finished product 100B. It will be appreciated that the solid naphthalene is filled in the gap 204 so that no liquid water is filled therein, and therefore the movable section 203 of the minute structure 200 cannon be drawn to the surface of the substrate 201 under the action of the surface tension of water during evaporation of water, thus avoiding arising of a phenomena in which the movable section 203 is brought into contact with or stuck to the surface of the substrate 201.

It will be appreciated that if the sacrifice etching process and the above processes of FIGS. 17A to 17C are accomplished immediately before a process of dividing the wafer into a plurality of chips by dicing, the dicing is made in the state of FIG. 17C thereby achieving prevention of both sticking of the movable section 203 to the surface of the substrate 201 and protection of the movable section 203 during dicing. This simplifies the total processes of the producing method for the minute device.

While IPA and naphthalene have been shown and described as being used respectively as the solvent and the sublimable material in the above example, it will be understood that other solvents and other sublimable materials may be used. The above-mentioned other solvents require to dissolve water and naphthalene and include methanol, ethanol, acetone and the like. Each of the solvents is usually used singly, but a plurality of the solvents may be used together upon forming a mixed solvent. Otherwise, the single solvent or the mixed solvent may contain the sublimable material. The above-mentioned other sublimable materials require to be sublimable at ordinary temperature and at normal (atmospheric) pressure and may include camphor which can be used, for example, in the above-discussed drying process after the etching process of the sacrifice layer even it is soluble in water.

Although the second embodiment producing methods of this embodiment have been discussed mainly on sensor structures each formed on the semiconductor substrate, it will be appreciated that the sensor structure may be formed, for example, on a glass substrate or a metal substrate, or on a surface portion of another structure other than the substrate. Additionally, the producing methods may be used to production of arrangements which do not include a minute device and are employed in production processes requiring a temporary protective film for a device or part having a minute structure.

Although naphthalene has been shown and described as being used as the sublimable material in the above producing method in FIGS. 8A to 17D, it will be understood that the naphthalene may be replaced with other materials which are solid at ordinary temperature and at normal pressure, such as camphor, p-dichlorobenzene, tetrachloro difluoroethane, terephthalic acid, isophthalic acid, trimesic acid or anthracene. In case that the sublimable material is brought into contact with water, for example, in the dicing process using water, the sublimable materials which are not reactive with and not soluble in water may be used.

While IPA has been shown and described as being used as the solvent for the sublimable material as also discussed above in the embodiments in FIGS. 8A to 17D, it will be understood that the IPA may be replaced with other solvents in which the sublimable material is soluble and by which a good wettability of the constituent materials of the minute device or sensor chip 10 is provided, examples of the solvents being methanol, ethanol, butanol, acetone, benzene, carbon disulfide, carbon tetrachloride, chloroform, hexane, decalin, tetralin, xylene, acetic acid, cyclohexanol, toluene and ether.

Furthermore, it will be appreciated that the principle of the present invention may be applicable to a variety of processes during which it is required to temporarily protect the minute structure from its breakage, penetration of dust, sticking and/or the like, such processes including physical and mechanical treatment processes such as storing, transportation, assembling and grinding, and chemical treatment processes such as plating, rinsing and etching which require treatment of the minute structure with gas and/or chemicals.

What is claimed is:

1. A method of producing a device including a minute structure having a cavity which is formed under a surface of the minute structure and communicated with a space on the surface, said method comprising the following steps in the sequence set forth:

dissolving a sublimable material in a solvent to form a sublimable material solution, the sublimable material being solid at ordinary temperature and normal pressure;

applying the sublimable material solution to the minute structure of the device, the solvent in the sublimable material solution having a characteristics that a wettability of a constituent material of the minute structure by the solvent is so high as to form a thin film of the sublimable material solution on the surface of the constituent material, said applying step including filling the sublimable material solution in the cavity of the minute structure;

converting the applied sublimable material solution into a state containing the sublimable material in solid phase so as to fill the sublimable material in the cavity of the minute structure, said converting step including concentrating the sublimable material solution under heating; and removing the sublimable material under sublimation.

2. A method as claimed in claim 1, further comprising the step of providing at lease one of physical and chemical treatments on the product of the device, after the converting step and before the sublimable material removing step.

3. A method as claimed in claim 1, wherein the concentrating step includes heating the sublimable material solution at a temperature around or higher than a melting point of the sublimable material.

4. A method as claimed in claim 1, further comprising the step of removing the sublimable material solution from a surface of the minute structure of the product of the device, after the sublimable material solution applying step.

5. A method as claimed in claim 4, wherein the removing step includes physically removing the sublimable material solution.

6. A method as claimed in claim 4, further comprising the step of forming a surface protective film on at lease one surface of the product of the device, after the sublimable material removing step.

7. A method as claimed in claim 6, wherein the surface protective film forming step includes applying a solid film on the surface of the product.

8. A method as claimed in claim 6, wherein the surface protective film forming step includes coating a liquid film which is solidifiable.

9. A method as claimed in claim 1, further comprising the step of storing the product with the sublimable material, after the converting step.

10. A method as claimed in claim 9, wherein the storing step includes storing the product with the sublimable material in open air.

11. A method as claimed in claim 9, wherein the storing step includes storing the product with the sublimable material within a hermetically sealed container.

12. A method as claimed in claim 9, wherein the storing step includes storing the product with the sublimable material under an equilibrium vapor pressure of the sublimable material at a predetermined temperature for storing.

13. A method as claimed in claim 2, wherein the physically treating step includes physically treating the product under an equilibrium vapor pressure of the sublimable material.

14. A method as claimed in claim 2, wherein the physically treating step includes allowing the product with the sublimable material to be in contact with an aqueous liquid, in which the sublimable material being negligible in reactivity and solubility to water.

15. A method as claimed in claim 1, wherein the sublimable material is at least one selected from the group consisting of naphthalene, camphor, p-dichlorobenzene, tetrachloro difluoroethane, terephthalic acid, isophthalic acid, trimesic acid, and anthracene.

16. A method as claimed in claim 1, wherein the solvent is at least one selected from the group consisting of isopropyl alcohol, methanol, ethanol, butanol, acetone, benzene, carbon disulfide, carbon tetrachloride, chloroform, hexane, decalin, tetralin, xylene, acetic acid, cyclohexanol, toluene, and ether.

17. A method as claimed in claim 1, wherein the sublimable material is naphthalene, and the solvent is isopropyl alcohol, wherein the sublimable material solution has a weight ratio of naphthalene/isopropyl alcohol=1/15.

18. A method as claimed in claim 1, wherein the minute structure has a movable section defining the cavity.

19. A method as claimed in claim 18, wherein the surface of the minute structure forms part of said movable section.

20. A method of producing a device having a minute structure, comprising the following steps:
  forming a film of a liquid containing a sublimable material on a surface of a product of the device, the sublimable material being solid at ordinary temperature and at normal pressure, the minute structure being formed at the surface of the product;
  improving a wettability of at least one of the minute structure and a region surrounding the minute structure, by the liquid film of the sublimable material;
  converting the liquid film into a state containing the sublimable material in solid phase so as to form a protective film;
  providing at least one of physical and chemical treatments on the product of the device, said providing step including dicing the product of the device; and subsequently
  vaporizing the protecting film to be removed.

21. A method as claimed in claim 20, wherein the step of improving a wettability includes providing a first material at a position close to the minute structure, the first material having a wettability by the liquid sublimable material, higher than wettability of the minute structure by the liquid sublimable material.

22. A method as claimed in claim 20, wherein the step of improving a wettability includes wetting the surface of the product of the device with a liquid containing a solvent for the sublimable material, the solvent having characteristics that the minute structure has a wettability by the solvent, higher than a wettability by the liquid sublimable material, the sublimable material being soluble in the solvent.

23. A method as claimed in claim 20, wherein the step of forming a liquid film includes heating at least the surface of the product of the device at a temperature not lower than a melting point of the sublimable material.

24. A method as claimed in claim 22, wherein the step of forming a liquid film includes heating at least the surface of the product of the device at a temperature not lower than a melting point of the sublimable material, wherein the heating includes heating the solvent at a temperature not higher than a boiling point of the solvent.

25. A method as claimed in claim 20, wherein the step of improving a wettability includes providing a first material at a surface of the product of the device, the first material having a wettability by the liquid sublimable material, higher than wettability of the minute structure by the liquid sublimable material.

26. A method as claimed in claim 21, wherein the first material is solid, wherein the solid first material having an outer-most periphery which is continuous and smooth to have no corner portion.

27. A method as claimed in claim 30, further comprising the step of providing a second material in a region surrounding the produce of the device, the liquid sublimable material, having a greater wettability for the second material than for the surface of the product of the device.

28. A method as claimed in claim 27, wherein the step of providing a second material includes providing the second material at the surface of the product of the device.

29. A method as claimed in claim 20, wherein the step of providing a physical treatment includes cleaning the product, before the step of forming a liquid film.

30. A method as claimed in claim 20, further comprising the step of allowing the liquid sublimable material into a cavity formed in the product of the device.

31. A method as claimed in claim 20, wherein the sublimable material includes at least one selected from group consisting of p-dichlorobenzene, tetrachloro difluoroethane, and camphor.

32. A method as claimed in claim 21, wherein the first material is a metal.

33. A method as claimed in claim 22, wherein the solvent is at least one selected from the group consisting of isopropyl alcohol, methanol, ethanol, butanol, acetone, benzene, carbon disulfide, carbon tetrachloride, chloroform, hexane, decalin, tetralin, xylene, acetic acid, cyclohexanol, toluene, and ether.

34. A method as claimed in claim 28, wherein the second material is one selected from the group consisting of oxide film, and synthetic resin.

35. A method of producing a device including a minute structure having a cavity which is formed under a surface of the minute structure and communicated with a space on the surface, said method comprising the following steps in the sequence set forth:
  applying a solvent of a sublimable material to the minute structure of the device, the solvent having a characteristics that a wettability of a constituent material of the minute structure by the solvent is so high as to form a thin film of the sublimable material solution on the surface of the constituent material, said applying step including filling the solvent in the cavity of the minute structure;
  replacing the solvent in the cavity with the sublimable material so as to fill the sublimable material in the cavity of the minute structure; and
  removing the sublimable material under sublimation.

36. A method as claimed in claim 35, wherein the minute structure has a movable section defining the cavity.

37. A method as claimed in claim 36, wherein the surface of the minute structure forms part of said movable section.

38. A method of producing a device including a minute structure having a cavity which is formed under a surface of the minute structure and communicated with a space on the surface, said method comprising the following steps:

surrounding the minute structure with a member which is higher in wettability than a constituent material of the minute structure by liquid containing a sublimable material so as to prevent the liquid containing the sublimable material from flowing out of a region surrounded with the member, said sublimable material being solid at ordinary temperature and at normal pressure;

applying a liquid containing a sublimable material within the region on a surface of the device, the liquid containing a solvent which has characteristics that a wettability of the constituent material of the minute structure by the solvent is so high as to form a thin film of the sublimable material solution on the surface of the constituent material;

converting the applied liquid containing the sublimable material into a state containing the sublimable material in solid phase; and removing the sublimable material under sublimation.

39. A method as claimed in claim 38, wherein the applying step includes filling the liquid containing the sublimable material into the cavity.

40. A method as claimed in claim 38, wherein the minute structure has a movable section defining the cavity.

41. A method as claimed in claim 40, wherein the surface of the minute structure forms part of said movable section.

* * * * *